(12) United States Patent
Tong et al.

(10) Patent No.: US 7,041,178 B2
(45) Date of Patent: May 9, 2006

(54) METHOD FOR LOW TEMPERATURE BONDING AND BONDED STRUCTURE

(75) Inventors: Qin-Yi Tong, Durham, NC (US); Gaius Gillman Fountain, Jr., Youngsville, NC (US); Paul M. Enquist, Cary, NC (US)

(73) Assignee: Ziptronix, Inc., Triangle Park, NC (US)

( * ) Notice: Subject to any disclaimer, the term of this patent is extended or adjusted under 35 U.S.C. 154(b) by 0 days.

(21) Appl. No.: 10/460,418

(22) Filed: Jun. 13, 2003

(65) Prior Publication Data
US 2003/0211705 A1 Nov. 13, 2003

Related U.S. Application Data

(62) Division of application No. 09/505,283, filed on Feb. 16, 2000, now Pat. No. 6,902,987.

(51) Int. Cl.
*H01L 21/48* (2006.01)

(52) U.S. Cl. ............... 148/33.4; 438/459; 438/485; 438/974; 148/DIG. 12

(58) Field of Classification Search ......... 438/455, 438/459, 406, 974, FOR. 107, FOR. 485, 438/107, 485; 148/DIG. 12, 33.4
See application file for complete search history.

(56) References Cited

U.S. PATENT DOCUMENTS

| 3,423,823 A | 1/1969 | Ansley |
| 3,488,834 A | 1/1970 | Baird |
| 3,508,980 A | 4/1970 | Jackson, Jr. et al. |
| 3,534,467 A | 10/1970 | Sachs et al. |
| 3,579,391 A | 5/1971 | Buie |
| 3,587,166 A | 6/1971 | Alexander et al. |
| 3,602,981 A | 9/1971 | Kool |
| 3,607,466 A | 9/1971 | Miyazaki |
| 3,640,807 A | 2/1972 | Van Dijk |
| 3,647,581 A | 3/1972 | Mash |
| 3,888,708 A | 6/1975 | Wise et al. |
| 4,416,054 A | 11/1983 | Thomas et al. |
| 4,612,083 A | 9/1986 | Yasumoto et al. |

(Continued)

FOREIGN PATENT DOCUMENTS

JP 54116888 A 3/1978

(Continued)

OTHER PUBLICATIONS

Tong et al, "Low Temperature Wafer Direct Bonding", Mar. 1994, IEEE, Journal of Microelectromechanical Systems, vol. 3, No. 1, pp. 29-35.*

(Continued)

*Primary Examiner*—George Fourson
*Assistant Examiner*—Joannie Adelle Garcia
(74) *Attorney, Agent, or Firm*—Oblon, Spivak, McClelland, Maier, Neustadt, P.C.

(57) ABSTRACT

A method for bonding at low or room temperature includes steps of surface cleaning and activation by cleaning or etching. The method may also include removing by-products of interface polymerization to prevent a reverse polymerization reaction to allow room temperature chemical bonding of materials such as silicon, silicon nitride and $SiO_2$. The surfaces to be bonded are polished to a high degree of smoothness and planarity. VSE may use reactive ion etching or wet etching to slightly etch the surfaces being bonded. The surface roughness and planarity are not degraded and may be enhanced by the VSE process. The etched surfaces may be rinsed in solutions such as ammonium hydroxide or ammonium fluoride to promote the formation of desired bonding species on the surfaces.

44 Claims, 9 Drawing Sheets

U.S. PATENT DOCUMENTS

| | | | |
|---|---|---|---|
| 4,617,160 A | 10/1986 | Belanger et al. | |
| 4,649,630 A | 3/1987 | Boland et al. | |
| 4,754,544 A | 7/1988 | Hanak | |
| 4,963,505 A | 10/1990 | Fujii et al. | |
| 4,970,175 A | 11/1990 | Haisma et al. | |
| 4,978,421 A | 12/1990 | Bassous et al. | |
| 5,024,723 A | 6/1991 | Goesele et al. | |
| 5,034,343 A | 7/1991 | Rouse et al. | |
| 5,070,026 A | 12/1991 | Greenwald et al. | |
| 5,071,792 A | 12/1991 | VanVonno et al. | |
| 5,081,061 A | 1/1992 | Rouse et al. | |
| 5,121,706 A | 6/1992 | Nichols et al. | |
| 5,162,251 A | 11/1992 | Poole et al. | |
| 5,183,783 A | 2/1993 | Ohta et al. | |
| 5,207,864 A * | 5/1993 | Bhat et al. | 438/455 |
| 5,421,953 A * | 6/1995 | Nagakubo et al. | 216/34 |
| 5,432,729 A | 7/1995 | Carson et al. | |
| 5,485,540 A | 1/1996 | Eda | |
| 5,489,554 A | 2/1996 | Gates | |
| 5,503,704 A | 4/1996 | Bower et al. | |
| 5,534,465 A | 7/1996 | Frye et al. | |
| 5,546,494 A | 8/1996 | Eda | |
| 5,548,178 A | 8/1996 | Eda et al. | |
| 5,563,084 A * | 10/1996 | Ramm et al. | 438/15 |
| 5,567,657 A | 10/1996 | Wojnarowski et al. | |
| 5,647,932 A | 7/1997 | Taguchi et al. | |
| 5,659,192 A * | 8/1997 | Sarma et al. | 257/347 |
| 5,666,706 A | 9/1997 | Tomita et al. | |
| 5,668,057 A | 9/1997 | Eda et al. | |
| 5,698,471 A | 12/1997 | Namba et al. | |
| 5,747,857 A | 5/1998 | Eda et al. | |
| 5,759,753 A | 6/1998 | Namba et al. | |
| 5,760,478 A | 6/1998 | Bozso et al. | |
| 5,771,555 A | 6/1998 | Eda et al. | |
| 5,783,477 A | 7/1998 | Kish, Jr. et al. | |
| 5,785,874 A | 7/1998 | Eda et al. | |
| 5,793,115 A | 8/1998 | Zavracky et al. | |
| 5,821,665 A | 10/1998 | Onishi et al. | |
| 5,841,197 A | 11/1998 | Adamic, Jr. | |
| 5,869,354 A | 2/1999 | Leedy | |
| 5,877,070 A | 3/1999 | Goesele et al. | |
| 5,880,010 A | 3/1999 | Davidson | |
| 5,910,699 A | 6/1999 | Namba et al. | |
| 5,915,167 A | 6/1999 | Leedy | |
| 5,915,193 A | 6/1999 | Tong et al. | |
| 5,920,142 A | 7/1999 | Onishi et al. | |
| 5,966,622 A | 10/1999 | Levine et al. | |
| 5,982,010 A | 11/1999 | Namba et al. | |
| 5,991,989 A | 11/1999 | Onishi et al. | |
| 6,018,211 A | 1/2000 | Kanaboshi et al. | |
| 6,087,760 A | 7/2000 | Yamaguchi et al. | |
| 6,120,917 A | 9/2000 | Eda | |
| 6,133,640 A | 10/2000 | Leedy | |
| 6,143,628 A | 11/2000 | Sato et al. | |
| 6,153,495 A | 11/2000 | Kub et al. | |
| 6,154,940 A | 12/2000 | Onishi et al. | |
| 6,156,624 A * | 12/2000 | Yamagata et al. | 438/459 |
| 6,180,496 B1 | 1/2001 | Farrens et al. | |
| 6,190,778 B1 | 2/2001 | Batz-Sohn et al. | |
| 6,236,141 B1 | 5/2001 | Sato et al. | |
| 6,246,068 B1 | 6/2001 | Sato et al. | |
| 6,255,731 B1 | 7/2001 | Ohmi et al. | |
| 6,270,202 B1 | 8/2001 | Namba et al. | |
| 6,284,085 B1 * | 9/2001 | Gwo | 156/273.7 |

FOREIGN PATENT DOCUMENTS

| | | |
|---|---|---|
| JP | 54155770 A | 5/1978 |
| JP | 60167439 A | 2/1984 |
| JP | 620031138 A | 8/1985 |
| JP | 63237408 A | 3/1987 |
| JP | 63246841 A | 4/1987 |
| JP | 01259546 A | 8/1988 |
| JP | 02177435 A | 12/1988 |
| JP | 03070155 A | 8/1989 |
| JP | 03101128 A | 9/1989 |

OTHER PUBLICATIONS

Schulze et al., "Investigation of Bonded Silicon-Silicon-Interfaces Using Scanning Acoustic Microscopy", Proceedings of the Second International Symposium on Microstructures and Microfabricated Systems, Proceedings vol. 95-27, pp. 309-318, (no date).

Tong, et al., "A New type of Materials Combination for System-On-A-Chip Preparation", 1999 IEEE International SOI Conference, pp. 104-105, Oct. 1999.

Kanda et al., "The Mechanism of Field-Assisted Silicon-Glass Bonding", Sensors and Actuators, vol. A21-A23, pp. 939-943, 1990.

Jiao et al., "Low-Temperature Silicon Direct Bonding and Interface Behaviours", Sensors and Actuators, vol. A50, pp. 117-120, 1995.

Berthold, et al., "Wafer-to-wafer Fusion Bonding of Oxidized Silicon to Silicon at Low Temperatures", Sensors and Actuators, vol. A68, pp. 410-413, 1998.

Tong et al., "Low Vacuum Wafer Bonding", Electromechanical and Solid-State Letters, vol. 1, No. 1, pp. 52-53, 1998.

Kissinger et al., "Void-Free Silicon-Wafer-Bond Strengthening in the 200-400 °C. Range", Sensors and Actuators, vol. A36, pp. 149-156, 1993.

Arora et al., "Reactive Ion-Etching-Induced Damage in Silicon Using $SF_6$ Gas Mixtures", J. Vac. Sci. Technol., vol. 85, No. 4, pp. 876-882, Jul./Aug. 1987.

Field, et al., "Fusing Silicon Wafers with Low Melting Temperature Glass", Sensors and Actuators, vol. A21-A23, pp. 935-938, 1990.

Bengtsson, et al., "Room Temperature Wafer Bonding of Silicon Oxidized Silicon, and Crystalline Quatrz", Journal of Electronic Materials, vol. 29, No. 7; 2000.

Amirfeiz, et al., "Formation of Silicon Structures by Plasma-Activated Wafer Bonding", Journal of Electrochemical Society, vol. 147, No. 7, pp. 2693-2698; 2000.

Pasquariello, et al., "Oxidation and Induced Damage in Oxygen Plasma in SITU Wafer Bonding", Journal of Electrochemical Society, vol. 147, No. 7, pp. 2699-2703; 2000.

Pasquariello, et al., "Mesa-Spacers: Enabling Nondestructive Measurement of Surface Energy in Room Temperature Wafer Bonding", Journal of the Electrochemical Society, vol. 174, No. 6, pp. 2343-2346; 2000.

Petzold, et al., "Interface Strength Characterization of Bonded Wafers", Proceedings of the Third International Symposium on Semiconductor Wafer Bonding: Physics and Applications, Proceedings vol. 95-7, pp. 380-389; (no date).

Bagdahn, et al., "Characterization of Directly Bonded Silicon Wafers by Means of the Double Cantilever Crack Opening Method", Proceedings of the Fourth International Symposium on Semiconductor Wafer Bonding: Science, Technology and Applications, Proceedings vol. 97-36, pp. 291-298; (no date).

P. Amirfeiz, et al., The 1999 Joint International Meeting, vol. 99-2, Abstract No. 963, 1 page, "Formation of Silicon Structures by Plasma Activated Wafer Bonding," Oct. 17-22, 1999.

F.J. Kub, et al., The 1999 Joint International Meeting, vol. 99-2, Abstract No. 1031, 1 page, "A Double-side IGBT by Low Temperature Wafer Bonding," Oct. 17-22, 1999.

S. Bengtsson, et al., International Conference on Compliant & Alternative Substrate Technology, p. 10, "Low Temperature Bonding," Sep. 1999.

S. Farrens. Electromechanical Society Proceedings, vol. 97-36, pps. 425-436, "Low Temperature Wafer Bonding," 1997.

S. Fujino, et al., Jpn. J. Appl. Phys., vol. 34, No. 108, 1 page, "Silicon Wafer Direct Bonding Through the Amorphous Layer," Oct. 15, 1995.

U. Gosele, et al., Appl. Phys. Lett., vol. 67, No. 24, pps. 3614-3616, "Self-Propagating Room-Temperature Silicon Wafer Bonding in Ultrahigh Vacuum," Dec. 11, 1995.

G. Hess, et al., Appl. Phys. Lett., vol. 71, No. 15, pps. 2184-2186, "Evolution of Subsurface Hydrogen From Boron-Doped Si(100)," Oct. 13, 1997...

K.D. Hobart, et al., Applied Physics Letters, vol. 72, No. 9, pps. 1095-1097, "Characterization of Si pn Junctions Fabricated by Direct Wafer Bonding in Ultra-High Vacuum," Mar. 2, 1998.

H. Kim. et al., Appl. Phys. Lett. vol. 69, No. 25, pps. 3869-3871, "Effects of B Doping on Hydrogen Desorption From Si(001) During Gas-Source Molecular-Beam Epitaxy From $Si_2H_6$ and $B_2H_6$" Dec. 16, 1996.

A. Ploessl, et al., Mat. Res. Soc. Symp. Proc., vol. 483, PPS. 141-146, "Covalent Silicon Bonding at Room Temperature in Ultrahigh Vacuum," 1998.

B.E. Roberos, et al., Electrochemical Society Proceedings, vol. 97-36, pps. 592-597, "Wafer Bonding of GaAS, InP, and Si Annealed Without Hydrogen for Advanced Device Technologies," 1997.

B.E. Roberos, et al., Electrochemical Society Proceedings, vol. 97-36, pps. 598-606, "Low Temperature, *In Situ*, Plasma Activated Wafer Bonding," 1997.

H. Takagi, et al., Appl. Phys. Lett., vol. 68, No. 16, pps. 2222-2224, "Surface Activated Bonding of Silicon Wafers at Room Temperature," Apr. 15, 1996.

Q.Y. Tong, et al., Appl. Phys. Lett., vol. 64, No. 5, pps. 625-627, "Hydrophobic Silicon Wafer Bonding," Jan. 31, 1994.

Q.Y. Tong, 9 pages, "Room Temperature Silicon and $SiO_2$ Convalent Bonding in Ambient," Dec. 10, 1999.

Amirfeiz et al., "Formation of Silicon Structures by Plasma Activated Wafer Bonding", Proceedings of the 5th Semiconductor Wafer Bonding Symposium, Oct. 1999, 11 pages.

Nakanishi et al., "Studies on $SiO_2$—$SiO_2$ Bonding with Hydrofluoric Acid -Room Temperature and Low Stress Bonding Technique for Mems-", IEEE 1998, pp. 609-614.

Stanchina, et al., "An InP-Based HBT Fab for High-Speed Digital, Analog, Mixed-Signal, and Optoelectronic Ics", IEEE Gallium Arsenide Integrated Circuit Symposium, Technical Digest 1995, pp. 31-34, Oct. 29-Nov. 1, 1995.

Nakamura, et al., "Giga-Bit Dram Cells With Low Capacitance and Low Resistance Bit-Lines on Buries MOSFETs and Capacitors by Using Bonded SOI Technology-Reversed-Stacked-Capacitor (RSTC) Cell", IEDM Technical Digest, vol. 95, pp. 889-892, Dec. 10-13, 1995.

Lasky, et al., "Silicon-On-Insulator (SOI) by Bonding and Etch-Back", IEDM Technical Digest, vol. 85, pp. 684-687, Dec. 1-4, 1985.

den Besten, et al., "Polymer Bonding of Micro-Machined Silicon Structures", IEEE Micro Electro Mechanical Systems, pp. 104-104, Feb. 4-7, 1992.

Pourahamdi, et al., "Variable-Flow Micro-Valve Structure Fabricated with Silicon Fusion Bonding", IEEE Solid-State Sensor and Actuator Workshop: Technical Digest, pp. 144-147, Jun. 4-7, 1990.

Bjeietich, et al., "Electrical Characterization of Plasma Bonded SOI", Proceedings of the Fourth International Symposium on Semiconductor Wafer Bonding: Science, Technology, and Applications, Proceedings vol. 97-36, pp. 346-357, (no date).

Dekker, et al., "An Ultra Low-Power RF Bipolar Technology on Glass", IEDM Technical Digest, vol. 97, pp. 921-923, Dec. 7-10, 1997.

Sunada, et al., "The Role of Fluorine Termination in the Chemical Stability of HF-Treated Si Surfaces", Jpn. J. Appl. Phys., vol. 29, No. 12, pp. L2408-L2410, Dec. 1990.

Yoshimaru, et al., "Interaction Between Water and Fluorine-Doped Silicon Oxide Films Deposited by Plasma-Enhanced Chemical Vapor Deposition", J. Vac. Sci. Technol. A, vol. 15, No. 6, pp. 2915-2922, Nov./Dec. 1997.

Duncan, et al. "Study of Fluorine in Silicate Glass with $^{19}$F Nuclear Magnetic Resonance Spectroscopy", J. Appl. Phys. vol. 50 No. 1, pp. 130-136, Jul. 1, 1986.

Rabinovich, et al., "Retention of Fluorine in Silica Gels and Glass", J. Am. Ceram. Soc., vol. 72, No. 7, pp. 1229-1232, 1989.

Nielsen, et al., "Some Illumination on the Mechanism of $SiO_2$ Etching in HF Solutions", J. Electrochem. Soc: Solid-State Science and Technology, vol. 130, No. 3, pp. 708-711, Mar. 1983.

Tong, et al., "Low Temperature inP Layer Transfer", Electronics Letters, vol. 35, No. 4, pp. 341-342, Feb. 18, 1999.

Tong, et al., "Semiconductor Wafer Bonding: Recent Developments", Materials Chemistry and Physics, vol. 37, pp. 101-127, 1994.

Mazara, et al., "Bonding of Silicon Wafers for Silicon-on-Insultor", J. Appl. Phys., vol. 64, No. 10, pp. 4943-4950, Nov. 15, 1988.

Bruel, "Silicon on Insulator Material Technology", Electronics Letters, vol. 31, No. 14, pp. 1201-1202, Jul. 6, 1995.

(No Author), "C.M.O.S. Devices Fabricated on Buried $SiO_2$ Layers Formed by Oxygen Implantation into Silicon", Electronics Letters, vol. 14, No. 18, pp. 593-594, Aug. 31, 1978.

Bergman, et al., "Donor-Hydrogen Complexes in Passivated Silicon", Physical Review B, vol. 37, No. 5, pp. 2770-2773, Feb. 15, 1988.

Mahan, et al., "Characterization of Microvoids in Device-Quality Hydrogenated Amorphous Silicon by Small-Angle X-Ray Scatterin and Infraed Measurements", Physical Review B, vol. 40, No. 17, pp. 12024-12027, Dec. 15, 1989.

Niwano, et al., "Morphology of Hydrofluoric Acid and Ammonium Fluoride-Treated Silicon Surfaces Studied by Surface Infrared Spectroscopy", J. Appl. Phys., vol. 71, No. 11, pp. 5646-5649, Jun. 1, 1992.

Borenstein, et al., "Kinetic Model for Hydrogen Reactions in Boron-Doped Silicon", J. Appl. Phys., vol. 73, No. 6, pp. 2751-2754, Mar. 15, 1993.

Lusson, et al., "Hydrogen Configurations and Stability in Amorphous Sputtered Silicon", J. Appl. Phys., vol. 81, No. 7, pp. 3073-3080, Apr. 1, 1997.

Pearton, et al., "Hydrogen in Crystalline Semiconductors", Appl. Phys. A. vol. 43, pp. 153-195, 1987.

McQuaid, et al., "Passivation, Structural Modification, and Etching of Amorphous Silicon in Hydrogen Plasmas", J. Appl. Phys., vol. 81, No. 11, pp. 7612-7618, Jun. 1, 1997.-

Bhattacharya, et al., "Transferred Substrate Schottky-Collector Heterojunction Bipolar Transistors: First Results and Scaling Laws for High $f$max", IEEE Electron Device Letters, vol. 16, No. 8, pp. 357-359, Aug. 1995.

Agarwal, et al., "A 277-GHz $f$max Transferred-Substrate Heterojunction Bipolar Transistor", IEEE Electron Device Letters, vol. 18, No. 5, pp. 228-231, May 1997.

Lee, et al., "A > 500 GHz $f$max Transferred-Substrate Heterojunction Bipolar Transistor IC Technology", IEEE Electron Device Letters, vol. 19, No. 3, pp. 77-79, Mar. 1998.

Lee, et al., "Submicron Transferred-Substrate Heterjunction Bipolar Transistors", IEEE Electron Device Letters, vol. 20, No. 8, pp. 396-398, Aug. 1999.

Mitani, et al., "A New Evaluation Method of Silicon Wafer Bonding Interfaces and Bonding Strength by KOH Etching", Jpn. J. Applied Phys., vol. 31, Part 1, No. 4, pp. 969-974, Apr. 1992.

Mitani, et al., "Causes and Prevention of Temperature-Dependent Buddies in Silicon Wafer Bonding", Jpn. J. Appl. Phys., vol. 30, No. 4, pp. 615-622, Apr. 1991.

Stengl, et al., "A Model for the Silicon Wafer Bonding Process", Jpn. J. Appl. Phys., vol. 28, No. 10, pp. 1735-1741, Oct. 1989.

Lee, et al., "A New Leakage Component Caused by the Interaction of Residual Stress and the Relative Position of Poly-Si Gate at Isolation Edge", IEDM Technical Digest, vol. 95-683, pp. 28.2.1-28.2.4, Dec. 10-13, 1995.

Spierings, et al., "Diversity and Interfacial Phenomena in Direct Bonding", Proceedings of the First International Symposium on Semiconductor Wafer Bonding: Science, Technology, and Applications Proceedings, vol. 92-7, pp. 18-32, (no date).

Yamahata, et al., "Over-220-GHz$f_t$-AND-$f_{max}$ InP/InGaAs Double-Heterojunction Bipolar Transistors with a new Hexagonal-Shaped Emitter", IEEE Gallium Arsenide Integrated Circuit Symposium, Technical Digest 1995, pp. 163-166, Oct. 29-Nov. 1, 1995.

Höchbauer, et al., "Hydrogen Blister Depth in Boron and Hydrogen Colmplanted N-type Silicon", Appl. Phys. Lett. vol. 75, No. 25, pp. 3938-3940, Dec. 20, 1999.

Tong, et al., "Layer Splitting Process in Hydrogen-Implanted Si, Ge, SIC, and Diamond Substrates", Appl. Phys. Lett. vol. 70, No. 11, pp. 1390-1392. Mar. 17, 1997.

Takagi, et al., "Room-Temperature Bonding of Lithium Nobate and Silicon Wafers by Argon-Beam Surface Activation", Appl. Phys. Lett., vol. 74, No. 16, pp. 2387-2389, Apr. 19, 1999.

Morita, et al., "Fluorine-Enhanced Thermal Oxidation of Silicon in the Presence of $NF_3$", Appl. Phys. Lett., vol. 45, No. 12, pp. 1312-1314, Dec. 15, 1984.

Ljungberg, et al., "Spontaneous Bonding of Hydrophobic Silicon Surfaces", Appl. Phys. Lett., vol. 82, No. 12, pp. 1362-1364, Mar. 22, 1993.

Meyerson, et al., "Bistable Conditions for Low-Temperature Silicon Epitaxy", Appl. Phys. Lett., vol. 57, No. 10, pp. 1034-1036, Sep. 3, 1990.

Tong, et al., "A "Smarter-Cut" Approach to Low Temperature Silicon Layer Transfer", Appl. Phys. Lett., vol. 72, No. 1, pp. 49-51, Jan. 5, 1998.

von Keudell, et al., "Evidence for Atomic H Insertion into Strained Si-Si Bonds in the Amorphous Hydrogenated Silicon Subsurface from In Situ Infrares Spectroscopy", Appl. Phys. Lett., vol. 71, No. 26, pp. 3832-3834, Dec. 29, 1997.

Judge, "A Study of the Dissolution of $SiO_2$ in Acidic Fluoride Solutions", J. Electrochem. Soc.: Solid State Science, vol. 118, No. 11, pp. 1772-1775, Nov. 1971.

Tong, et al., "A Model of Low-Temperature Wafer Bonding and its Applications", J. Electrochem. Soc., vol. 143, No. 5, pp. 1773-1779, May 1996.

Mack, et al., "Analysis of Bonding-Related Gas Enclosure in Micromachined Cavities Sealed by Silicon Wafer Bonding", J. Electrochem, Soc., vol. 144, No. 3, pp. 1106-1111, Mar. 1997.

Aspar, et al., "Basic Mechanisms Invovled in the Smart-Cut® Process", Microelectronic Engineering, vol. 36, pp. 233-240, 1997.

Li, et al., "Surface Roughness of Hyrdogen Ion Cut Low Temperature Bonded Thin Film Layers", Jpn. J. Appl. Phys., vol. 39, Part 1, No. 1, pp. 275-276, Jan. 2000.

Ljungberg, et al., "Modification of Silicon Surfaces with $H_2SO_4$:$H_2O_2$:HF and $HNO_3$: HF For Wafer Bonding Applications", Electrochemical Society Proceedings, vol. 95-7, pp. 163-173, (no date).

Michalske, et al., "Closure and Repropagation of Healed Cracks in Silicate Glass", J. Am. Ceram. Soc., vol. 68, No. 11, pp. 586-590, 1985.

Denteneer, et al., "Microscopic Structure of the Hydrogen-Boron Complex in Crystalline Silicon", Physical Review B, vol. 39, Nov. 15, pp. 10809-10824, May 15, 1989.

Gupta, et al., "Hydrogen Desorption Kinetics from Monohydride and Dihydride Species on Silicon Surfaces", Physical Review B, vol. 37, No. 14, pp. 8234-8243, May 15, 1988.

Plossel, et al., "Wafer Direct Bonding: Tailoring Adhesion Between Brittle Materials", Materials Science & Engineering, vol. R25, Nos. 1-2, pp. 1-88, Mar. 10, 1999.

Ohmi, et al., "VLSI Interconnects for Ultra High Speed Signal Propagation", Proceedings Fifth International IEEE VLSI Multilevel Interconnection Conference, pp. 261-267, Jun. 13-14, 1987.

Liu, et al., "Current Gain Collapse in Microwave Multifinger Heterjunction Bipolar Transistors Operated at Very High Power Densities", IEEE Transactions on Electron Devices, vol. 40, No. 11, pp. 1917-1927, Nov. 1993.

Tong, et al., "Smart-Cut®: Recent Advances in Layer Transfer for Material Integration", MRS Bulletin, pp. 40-44, Dec. 1998.

Haisma, "Direct Bonding in Patent Literature", Philips Journal of Research, vol. 49, No. 1/2, pp. 165-170, 1995.

Spierings, et al., "Surface-Related Phenomena in the Direct Bonding of Silicon and Fused-Silica Wafer Pairs", Phillips Journal of Research, vol. 49, No. 1/2, pp. 47-53, 1995.

Gillis, et al., "Double-Cantilever Cleavage Mode of Crack Propagation", Journal of Applied Physics, vol. 35, No. 3 (Part 1), pp. 647-658, Mar. 1964.

Kazor, et al., "Fluorine Enhanced Oxidation of Silicon at Low Temperatures", Appl. Phys. Lett. vol. 65, No. 12, pp. 1572-1574, Sep. 19, 1994.

Williams, et al., "Mobile Fluoride Ions in $SiO_2$", Journal of Applied Physics, vol. 46, No. 2, pp. 695-698, Feb. 1975.

Kasi, et al., "Chemistry of Fluorine in the Oxidation of Silicon", App. Phys. Letters., vol. 58, No. 25, pp. 2975-2977, Jun. 24, 1991.

Messoussi, et al., "Improvement of Rinsing Efficiency After Sulfuric Acid Hydrogen Peroxide Mixture by HF Addition", Jpn. J. Appl. Phys., vol. 35, Part 1, No. 4A, pp. 1989-1992, 1996.

Takizawa, et al., "Ultraclean Technique for Silicon Wafer Surfaces with HNO₃-HF Systems", Japan Journal of Applied Physics, vol. 27, No. 11, pp. L2210-L2212, Nov. 1998.

Stengl, et al., "Bubble-Free Silicon Wafer Bonding in a Non-Cleanroom Environment", Japan Journal of Applied Physics, vol. 27, No. 12, pp. L2364-2366, Dec. 1988.

Abe, et al., "Silicon Wafer Bonding Mechanism for Silicon-on-Insulator Structures", Japan Journal Applied Physics, vol. 29, No. 12, pp. L2311-L2314, Dec. 1990.

Chu, et al., "Distribution of Irradiation Damage in Silicon Bombarded with Hydrogen", Physical Review B, vol. 16, No. 9, pp. 3851-3859. Nov. 1, 1977.

Nishioka, et al., "Dielectric Characteristics of Fluorinated Ultradry $SiO_2$", Appl. Phys. Lett. vol. 54, No. 12, pp. 1127-1129, Mar. 20, 1999.

Kouvatsos, et al., "Silicon-Fluorine Bonding and Fluorine Profiling in $SiO_2$ Films Grown by $NF_3$-Enhanced Oxidation", Appl. Phys. Lett., vol. 61, No. 7, pp. 780-782, Aug. 17, 1992.

Khanh, et al., "Nondestructive Detection of Microvoids at the Interface of Direct Bonded Silicon Wafers by Scanning Infrared Microscopy", J. Electrochem Soc. vol. 142, No. 7, pp. 2425-2429, Jul. 1995.

Tong, et al., "Wafer Bonding and Layer Splitting for Microsystems", Adv. Mater., vol. 11, No. 17, pp. 1409-1425, 1999.

Maszara, "Silicon-on-Insulator by Wafer Bonding:A Review", J. Electrochem Soc. vol. 138, No. 1, pp. 341-347, Jan. 19991.

Sun et al., "Cool Plasma Activated Surface in Silicon Wafer Direct Bonding Technology", Journal De Physique, pp. C4-79 to C4-82, Sep. 1988.

Goetz, "Generalized Reactive Bonding", Proceedings of the 1st Semiconductor Wafer Bonding Symposium, 1991, pp. 65-73.

Zucker et al., "Application of Oxygen Plasma Processing to Silicon Direct Bonding", Sensors and Actuators A, 36 (1993), pp. 227-231.

Farrens et al., "Chemical Free Room Temperature Wafer to Wafer Direct Bonding", J. Electrochem. Soc., vol. 142, No. 11, Nov. 1995, pp. 3949-3955.

H. Takagi, et al., "Transmission Electron Microscope Obeservations of Si/Si Interface Bonded at Room Temperature by Ar Beam Surface Activation", Jpn. J. Appl. Phys. vol. 38, Part 1, No. 3A, pp. 1589-1594, Mar. 1999.

T. Akatsu, et al., "GaAs Wafer Bonding by Atomic Hydrogen Surface Cleaning", Journal of Applied Physics, vol. 86, No. 12, pp. 7146-7150, Dec. 15, 1999.

L. Rayleigh, "A Study of Glass Surfaces in Optical Contact", Proceedings of the Royal Society of London, Series A—Mathematical and Physical Sciences, vol. 156, pp. 326-349, Sep. 1, 1936.

M.K. Weldon, et al., "Mechanistic Studies of Silicon Wafer Bonding and Layer Exfoliation", Proceedings of the Fourth International Symposium on Semiconductor Wafer Bonding: Science, Technology, and Applications, Proceedings vol. 97-36, pp. 229-248, (no date).

Dino R. Ciarlo, "High—and Low-Temperature Bonding Techniques for Microstructures", Proceedings of the Second International Symposium on Semiconductor Wafer Bonding: Science, Technology and Applications, Proceedings vol. 93-29, pp. 313-326, May 1993.

R.C. Ross, et al., "Physical Microstructure in Device-Quality Hydrogenated Amorphous Silicon", Journal of Non-Crystalline Solids, vol. 66, pp. 81-86, 1984.

W.H. Ko et al., "Bonding Techniques for Microsensors", Micromachining and Micropackaging of Transducers, pp. 41-61, 1985.

Auberton-Herve', et al., "Silicon on Insulator Wafers Using the Smart Cut® Technology", Proceedings of the Eighth International Symposium on Silicon Materials:Science and Technology, Silicon Materials Science and Technology, vol. 2, Electrochemical Society Proceedings, vol. 98-1, pp. 1341-1360.

Kiyoshi Mitani, "Wafer Bonding Studies of Interface Bubbles and Electrical Characterization", Department of Electrical Engineering, Duke University, 1991.

D. Gref, et al., "Reaction of Water with Hydrofluorc Acide Treated Silicon (111) and (100 Surfaces", J. Vac. Sci. Technol., A7(3), pp. 806-813, May/Jun. 1989.

M. Grudner, et al., "Investigations on Hydrophilic and Hydrophobic Silicon (100) Wafer Surfaces by X-Ray Photoelectron and High-Resolution Electron Energy Loss-Spectroscopy", Appl. Phys. A, vol. 39, pp. 73-82, 1986.

Wen Hsiung Ho, et al., "Development of a Miniature Pressure Transducer for Biomedical Applications", IEEE Transactions on Electron Devices, vol. ED-26, No. 12, pp. 1896-1905, Dec. 1979.

George P. Imthum, et al., "Bonded Silicon-on-Sapphire Wafers and Devices", J. Appl. Phys., vol. 72, No. 6, pp. 2526-2527, Sep. 15, 1992.

M. Shimbo, et al., "Silicon-to-Silicon Direct Bonding Method", J. Appl. Phys. vol. 60, No. 8, pp. 2987-2989, Oct. 15, 1986.

J.B. Lasky, "Wafer Bonding for Silicon-on-Insulator Technologies", Appl. Phys. Lett. vol. 48, No. 1, Jan. 6, 1986.

Darrell Hill, et al., "Novel HBT with Reduced Thermal Impedance", IEEE Microwaves and Guided Wave Letters, vol. 5, No. 11, pp. 373-375, Nov. 1995.

J.F. Jensen, et al., A 3.2-GHz Second-Order Delta-Sigma Modulator Implemented in InP HBT Technology, IEEE Journal of Solid-Stated Circuits, vol. 30, No. 10, pp. 1119-1127, Oct. 1995.

Burhan Bayraktaroglu, et al., "Very High-Power-Denisty CW Operation of GaSa/AlGaAs Microwave Heterojunction Bipolar Transistors", Oct. 1993.

Alex Q. Huang, "Analysis of the Inductive Turn-Off of Double Gate MOS Controlled Thyristors", IEEE Transactions on Electron Devices, vol. 43, No. 6, pp. 1029-1032, Jun. 1996.

Peter J. Wright, et al., "The Effect of Fluorine In Silicon Dioxide Gate Dielectrics", IEEE Transactions on Electron Devices, vol. 36, No. 5, pp. 879-889, May 1989.

* cited by examiner

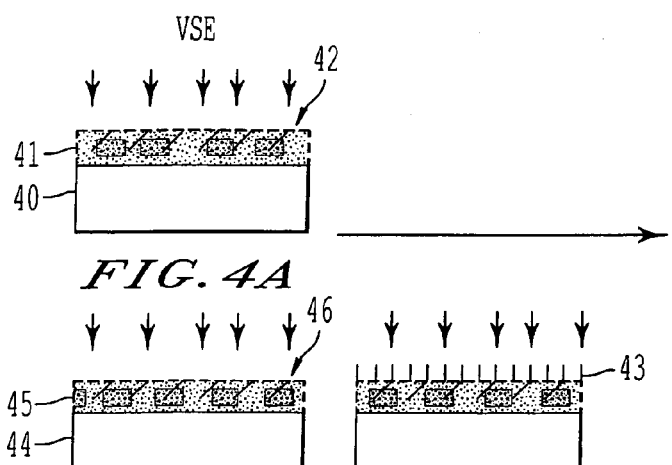
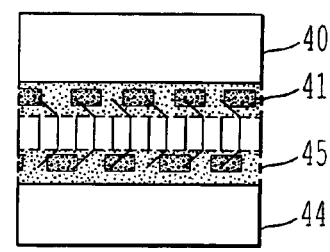
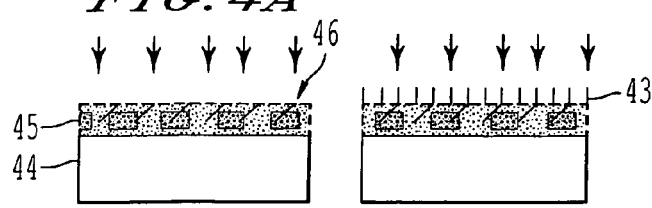
FIG. 4A    FIG. 4B    FIG. 4C    FIG. 4D
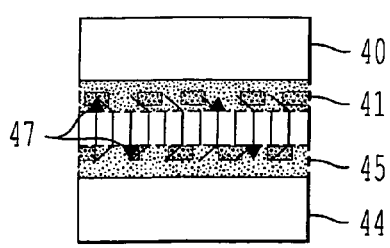
FIG. 4E

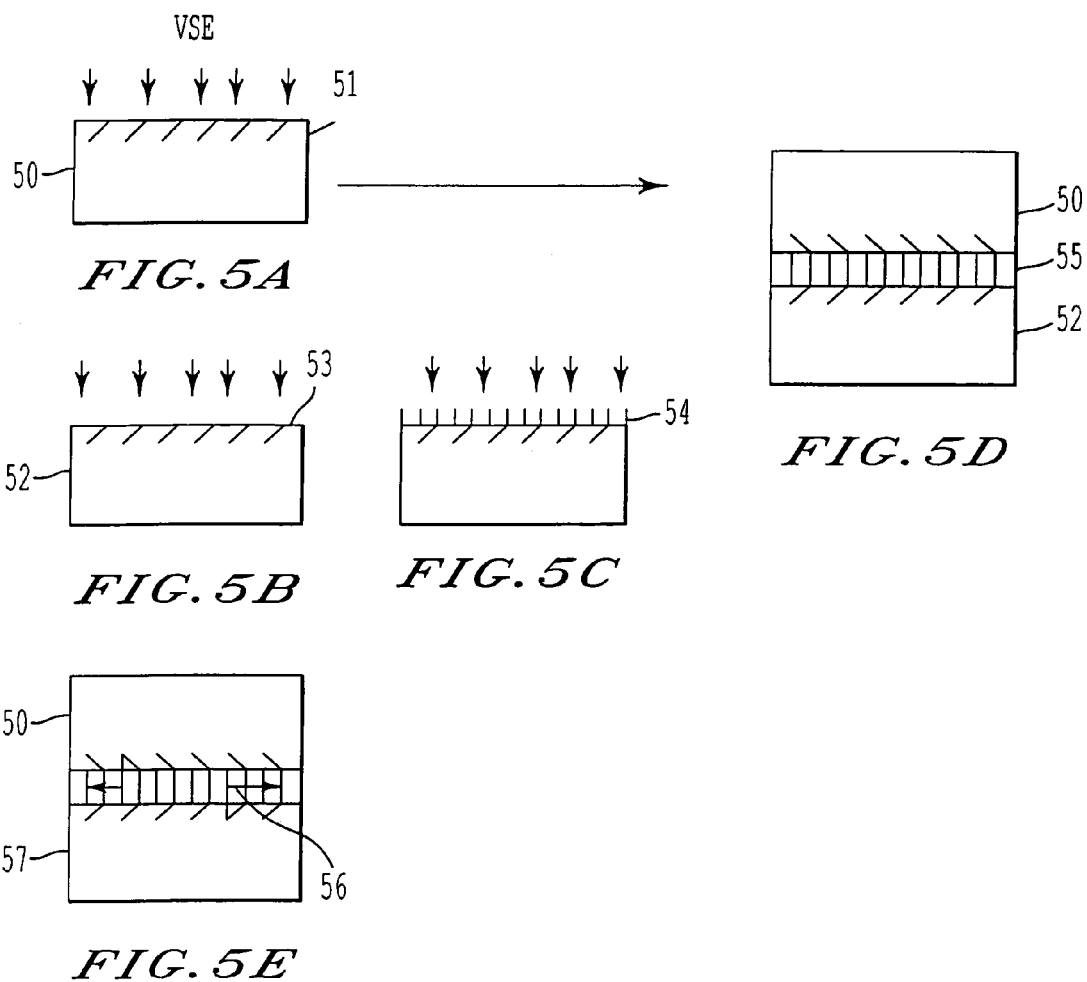

METHOD FOR LOW TEMPERATURE BONDING AND BONDED STRUCTURE

BACKGROUND OF THE INVENTION

1. Field of the Invention

The present invention relates to bonding of materials at room temperature and, in particular, to bonding of processed semiconductor materials, such as integrated circuit or device substrates, having activated surfaces to achieve high bonding strength adequate for subsequent fabrication and/or a desired application.

2. Background of the Invention

Direct room temperature bonding generally produces weak van der Waals or hydrogen bonding. Annealing is typically required to convert the weak bond to a stronger chemical bond such as a covalent bond. Other wafer bonding techniques including anodic and fusion typically require the application of voltage, pressure and/or annealing at elevated temperature to achieve a sufficient bond strength for subsequent fabrication and/or the desired application. The need to apply voltage, pressure or heat has significantly limited wafer bonding applications because these parameters can damage the materials being wafer bonded, give rise to internal stress and introduce undesirable changes in the devices or materials being bonded. Achieving a strong bond at low temperatures is also critical for bonding of thermally mismatched or thermally sensitive wafers including processed device wafers.

Ultra high vacuum (UHV) bonding is one of the approaches to achieve a low or room temperature strong bond. However, the bonding wafers still have to be pre-annealed at high temperatures, for instance >600° C. for silicon and 500° C. for GaAs, before cooling down to low or room temperature for bonding. Furthermore, the UHV approach does not generally work on commonly used materials, for example, in $SiO_2$. It is further also expensive and inefficient.

Adhesive layers can also be used to bond device wafers to a variety of substrates and to transfer device layers at low temperatures. However, thermal and chemical instability, interface bubbles, stress and the inhomogeneous nature of adhesive layers prevent its wide application. It is thus highly desirable to achieve a strong bond at room temperature by bonding wafers in ambient without any adhesive, external pressure or applied electric field.

Low vacuum bonding has been explored as a more convenient alternative to UHV bonding but a bonding energy comparable to the bulk silicon fracture energy using bonded bare silicon wafer pairs has only be achieved after annealing at ~150° C. For oxide covered silicon wafer pairs annealing at ~300° C. is required to obtain a high bond energy. It has not been possible to obtain high bonding energies in bonded material using low vacuum bonding at room temperature.

A gas plasma treatment prior to bonding in ambient is known to enhance the bonding energy of bonded silicon pairs at low or room temperature. See, for example, G. L. Sun, Q. -Y. Tong, et al., J. de Physique, 49(C4), 79 (1988); G. G. Goetz, Proc.of 1st Intl. Symp. on Semicond. Wafer Bonding: Science, Technol. and Applications, The Electrochem. Soc., 92-7, 65 (1992); S. Farrens et al., J. Electroch. Soc., 142,3950 (1995) and Amirffeiz et al, Abstracts of 5th Intl. Symp. on Semi. Wafer Bonding: Science, Tech. and Appl., The Electrochemical Society, 99-2, Abstract No. 963 (1999). Although these treatments have increased the bond energy obtainable at low or room temperature, they have only been demonstrated with planar silicon wafers or with silicon wafers using a plasma process that results in oxide being grown on the wafers during the plasma process. Moreover, these treatments have only been used to increase the bond energy by charging or damaging the surface. Furthermore, these treatments have not been used or shown to be applicable to deposited dielectrics or other materials.

Obtaining low or room temperature bonding with a method that is not only applicable to planar silicon and grown oxide surfaces but further to deposited materials and non-planar surfaces with planarized deposited materials will allow generic materials, including processed semiconductor wafers, to be bonded with minimal damage for manufacturing purposes. Such a method based on etching and chemical bonding is described herein.

SUMMARY OF THE INVENTION

It is an object of the invention to provide a method for bonding materials at low or room temperature.

It is another object of the invention to bond materials by cleaning and activating the bonding surfaces to promote chemical bond formation at about room temperature.

It is a further object of the invention to provide a bonding method to bond any solid state material such as processed device or integrated circuit wafers or thermally sensitive or mismatched materials at or about room temperature.

It is further object of the invention to provide a bonding method to bond processed device or integrated circuit wafers of different types of devices or different technologies, and transfer a layer of devices or circuits at or about room temperature.

It is another object of the invention to enable a direct wafer bonding method that does not require annealing to achieve a required bond strength.

It is a further object of the invention to provide a method whereby diverse materials including those with non-planar surfaces and deposited materials can be planarized and bonded.

These and other objects are achieved by a method of bonding having steps of forming first and second bonding surfaces, etching the first and second bonding surfaces, and bonding together at room temperature the first and second bonding surfaces after said etching step. The etching may include etching the first and second bonding surfaces such that respective surface roughnesses of the first and second bonding surfaces after said etching are substantially the same as respective surface rouglnesses before said etching. The surface roughness may be in a range of 0.1 to 3.0 nm.

The bonding surfaces may be the surface of a deposited insulating material, such as silicon oxide, silicon nitride or a dielectric polymer. The bonding surface may also be the surface of a silicon wafer. Silicon wafers, using either the surface of the wafer or a deposited material on the wafer, may be bonded together. The wafers may have devices or integrated circuits formed therein. The devices and circuits in the wafers bonded together may be interconnected. The wafers may have a non-planar surface or an irregular surface topology upon which a material is deposited to form the bonding surfaces.

Forming at least one of the bonding surfaces may include depositing a polishable material on a non-planar surface. Depositing said polishable material may include depositing one of silicon oxide, silicon nitride or a dielectric polymer. The bonding surfaces may be polished using a method such as chemical-mechanical polishing. The surfaces may also be etched prior to the polishing.

The etching step may also include activating the first and second bonding surfaces and forming selected bonding groups on the first and second bonding surfaces. Bonding groups may also be formed capable of forming chemical bonds at approximately room temperature, and chemical bonds may be formed between the bonding surfaces allowing bonded groups to diffuse or dissociate away from an interface of the bonding surfaces. The chemical bonds can increase the bonding strength between the bonding surfaces by diffusing or dissociating away said bonding groups.

After said etching step, the bonding surfaces may be immersed in a solution to form bonding surfaces terminated with desired species. The species may comprise at least one of a silanol group, an $NH_2$ group, a fluorine group and an HF group. Also, a monolayer of one of a desired atom and a desired molecule may be formed on the bonding surface. Terminating the surface may include rinsing said bonding materials in an ammonia-based solution after said slightly etching. The ammonia-based solution may be ammonium hydroxide or ammonium fluoride.

The method may also include exposing the bonding surfaces to one of an oxygen, argon, $NH_3$ and $CF_4$ RIE plasma process. Silicon dioxide may be deposited as to form the bonding surfaces, and etched using the RIE process.

The etching process may create a defective or damaged zone proximate to the bonding surfaces. The defective or damaged zone can facilitate the removal of bonding by-products through diffusion or dissociation.

The method may also include steps of forming first and second bonding surfaces, etching the bonding surfaces, terminating the bonding surfaces with a species allowing formation of chemical bonds at about room temperature, and bonding the bonding surfaces at about room temperature, or may include steps of forming the bonding surfaces each having a surface roughness in a range of 0.1 to 3 nm, removing material from the bonding surfaces while maintaining said surface roughness, and directly bonding the bonding surfaces at room temperature with a bonding strength of at least 500 $mJ/m^2$, at least 1000 $mJ/m^2$, or at least 2000 $mJ/m^2$.

The objects of the invention may also be achieved by a bonded device having a first material having a first etched bonding surface, and a second material having a second etched bonding surface directly bonded to the first bonding surface at room temperature having a bonding strength of at least 500 to 2000 $mJ/m^2$. The bonding surfaces may be being activated and terminated with a desired bonding species, and the desired species may include a monolayer of one of a desired atom and a desired molecule on said bonding surface or at least one of a silanol group, an $NH_2$ group, a fluorine group and an HF group. The bonding surfaces may each have a defective region located proximate to said first and second bonding surfaces, respectively.

The first material may include a surface of a first semiconductor wafer having devices formed therein, and the second material may include a surface of a second semiconductor wafer having devices formed therein. Devices in the wafers may be interconnected, and the wafers may be of different technologies. The wafers may also have an integrated circuit formed therein, and devices or circuits in the wafers may be interconnected.

One of said first and second wafers may be a device region after removing a substantial portion of a substrate of said one of said first and second wafers. The wafers may have an irregular surface topology.

The first material may include a first wafer containing electrical devices and having a first non-planar surface, and the first bonding surface may include a polished and etched deposited oxide layer on said first non-planar surface. The second material may include a second wafer containing electrical devices and having a second non-planar surface, and the second bonding surface may include a polished, planarized and slightly etched deposited oxide layer on the second non-planar surface.

The first material may include a first wafer containing electrical devices and having a first surface with irregular topology, and the first bonding surface may include a polished, planarized and slightly etched deposited oxide layer on the first surface. The second material may include a second wafer containing electrical devices and having a second surface with irregular topology, and the second bonding surface may include a polished, planarized and slightly etched deposited oxide layer on the second surface.

The bonded device according to the invention may also include a first material having a first etched and activated bonding surface terminated with a first desired bonding species, and a second material having a second etched and activated bonding surface terminated with a second desired bonding species bonded to the first bonding surface at room temperature.

BRIEF DESCRIPTION OF THE DRAWINGS

A more complete appreciation of the invention and many of the attendant advantages thereof are readily obtained as the same become better understood by reference to the following detailed description when considered in connection with the accompanying drawings, wherein:

FIG. 4 is a diagram illustrating bonding according to the invention using silicon oxide;

FIG. 5 is a diagram illustrating bonding according to the invention using silicon;

DESCRIPTION OF THE PREFERRED EMBODIMENTS

Referring to FIGS. 1 and 3A–3E, a first embodiment of the method according to the invention will be described. Wafer 30, preferably a processed semiconductor device wafer and more preferably a processed silicon device wafer, contains a device layer 31 with processed devices. Device layer 31 may contain a number of layers and include surface regions of wafer 30. The surface topography of layer 31 is typically nonplanar. Layer 31 may also represent a processed integrated circuit containing any number of layers such as active devices, interconnection, insulation, etc.

The integrated circuit may be fully processed, or partially processed where the remaining processing is performed after the bonding process. The processing after the bonding may include full or partial substrate removal or via formation between the bonded wafers for interconnection.

Figure 1:
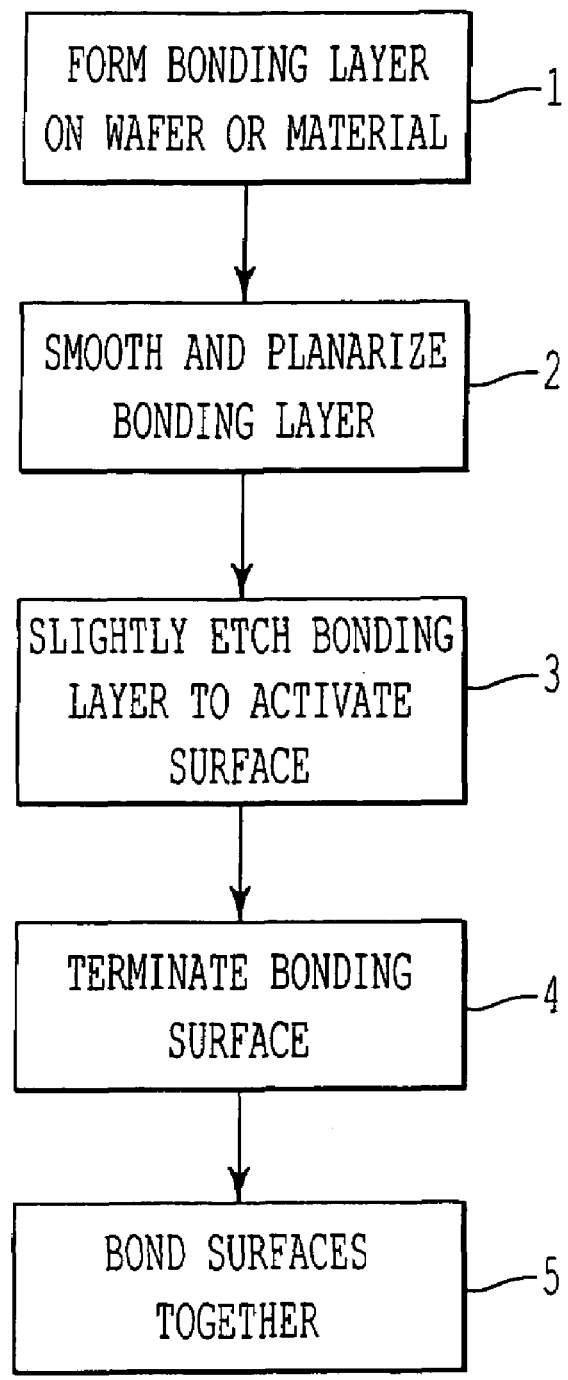
FIG. 1 is a flow chart of the method according to the invention.

On layer 31 a bonding layer 32 is formed (step 1, FIG. 1). Bonding layer 32 may be any solid state material or mixed materials which can be deposited or formed at low temperatures and can be polished to a sufficiently smooth surface. Layer 32 may be an insulator, such as $SiO_2$, silicon nitride, amorphous silicon formed using chemical vapor deposition (CVD) or plasma-enhanced CVD (PECVD), sputtering or by evaporation. Other materials such as polymers, semiconductors or sintered materials may also be used. Layer 32 should have thickness greater than the surface topography of layer 31.

Figure 3A:
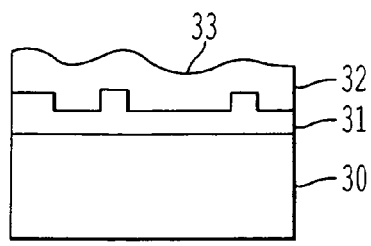
FIGS. 3A–3E are diagrams illustrating a first embodiment of a method according to the invention.
Figure 3B:
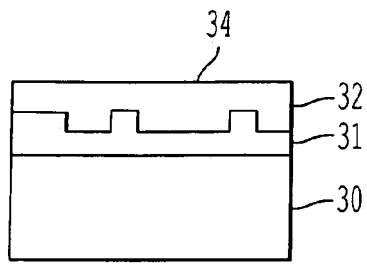

The surface 33 of layer 32 is planarized and smoothed, as shown in step 2 of FIG. 1 and in FIG. 3B. It is noted that the roughness/planarity of surface 33 is exaggerated in FIG. 3A for illustrative purposes. This step may be accomplished using chemical-mechanical polishing. Surface 33 is preferably polished to a roughness of about no more than about 3 nm and preferably no more than about 0.1 nm and be substantially planar. The surface roughness values are typically given as root-mean square (RMS) values. Also, the surface roughness may be given as mean values which are nearly the same as the RMS values. After polishing surface 33 is cleaned and dried to remove any residue from the polishing step. Polished surface 33 is preferably then rinsed with a solution.

The bonding surface may also be etched prior to polishing to improve the planarity and/or surface roughness. The etching can be effective to remove high spots on the bonding surface by selective etching of the high spots using, for example, standard photolithographic techniques. For example, a layer of silicon nitride can be embedded within a silicon dioxide bonding layer 32 that can serve as an etch stop when using a solution containing HF. The etch stop material may be used to improve uniformity, reproducibility, and manufacturability.

Figure 3C:
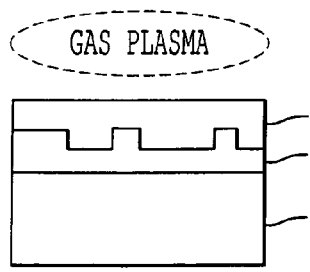

FIG. 3B illustrates layer 32 having upper surface 34 after the polishing/planarization and cleaning steps. Surface 34 then undergoes an activation process (step 3, FIG. 1). This activation process is an etching process and preferably a very slight etch (VSE) process. The term VSE means that the root-mean-square micro-roughness (RMS) of the very slightly etched surface remains at approximately the unetched value, typically <0.5 nm and preferably in the range of 0.1 nm to 3 nm. The optimum amount of material removed depends upon the material and the method used for removal. Typical amounts removed vary from Angstroms to a few nanometers. It is also possible to remove more material. VSE also includes the breaking of bonds on the treated surfaces and can occur without significant removal of material. The VSE is distinct from simple modification of the surface by, for example, charging the surface with electronic charge or damaging the surface layer. In a first example of the method according to the invention, the VSE process consists of a gas or mixed gas (such as oxygen, argon, nitrogen, $CF_4$, $NH_3$) plasma process at a specified power level for a specified time (FIG. 3C). The power and duration of the plasma process will vary depending upon the materials used to obtain the desired bond energy. Examples are given below, but in general, the power and duration will be determined empirically.

The plasma process may be conducted in different modes. Both reactive ion etch (RIE) and plasma modes may be used, as well as an inductively-coupled plasma mode (ICP). Sputtering may also be used. Data and examples are given below in both the RIE and plasma modes.

The VSE process etches the surface very slightly via physical sputtering and/or chemical reaction and preferably is controlled to not degrade the surface roughness of the bonding surfaces. The surface roughness may even be improved depending upon the VSE and materials etched. Almost any gas or gas mixture that will not etch surface 34 excessively can be used for the room temperature bonding method according to the invention.

The VSE serves to clean the surface and break bonds of the oxide on the wafer surface. The VSE process can thus enhance the surface activation significantly. A desired bonding species can be terminated on surface 34 during the VSE by proper design of the VSE. Alternatively, a post-VSE treatment that activates and terminates the surface with a desired terminating species during the post-VSE process may be used.

Figure 3D:
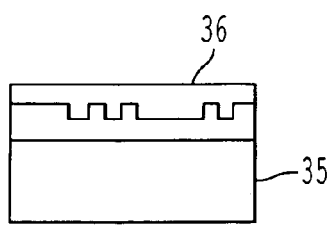

The desired species further preferably forms a temporary bond to the surface 34 atomic layer, effectively terminating the atomic layer, until a subsequent time that this surface can be brought together with a surface terminated by the same or another bonding species 36 as shown in FIG. 3D. Desired species on the surfaces will further preferably react with each other when they are in sufficiently close proximity allowing chemical bonding between surfaces 34 and 36 at low or room temperature that is enhanced by diffusion or dissociation and diffusion of the reacted desired species away from the bonding interface.

The post-VSE process preferably consists of immersion in a solution containing a selected chemical to generate surface reactions that result in terminating the bonding surface 34 with desired species. The immersion is preferably performed immediately after the VSE process. The post-VSE process may be performed in the same apparatus in which the VSE process is conducted. This is done most readily if both VSE and post-VSE processes are either dry, i.e, plasma, RIE, ICP, sputtering, etc, or wet, i.e., solution immersion. A desired species preferably consists of a monolayer or a few monolayers of atoms or molecules.

The post-VSE process may also consist of a plasma, RIE, or other dry process whereby appropriate gas chemistries are introduced to result in termination of the surface with the desired species. The post-VSE process may also be a second VSE process. The termination process may also include a cleaning process where surface contaminants are removed without VSE. In this case, a post-cleaning process similar to the post-VSE processes described above then results in a desired surface termination.

The post-VSE or post-cleaning process may or may not be needed to tenninate surfaces with desired species if the activated surface bonds by the cleaning or VSE process are subsequently sufficiently weakly surface reconstructed and can remain sufficiently clean before bonding such that subsequent bonding with a similar surface can form a chemical bond.

Figure 3E:
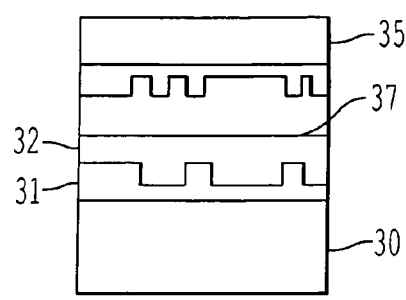

The wafers are optionally rinsed then dried. Two wafers are bonded by aligning them (if necessary) and bringing them together to fonm a bonding interface. As shown in FIG. 3D, a second wafer 35 has been processed in the manner shown in FIG. 3C to prepare bonding surface 36. The two wafers are brought together by, for example, commercially available wafer bonding equipment (not shown) to initiate bonding interface 37 (FIG. 3E).

A spontaneous bond then typically occurs at some location in the bonding interface and propagates across the wafer. As the initial bond begins to propagate, a chemical reaction such as polymerization that results in chemical bonds takes place between species used to tenninate surfaces 34 and 36 when the surfaces are in sufficient proximity. The bonding energy is defined as the specific surface energy of one of the separated surfaces at the bonding interface that is partially debonded by inserting a wedge. The by-products of the reaction then diffuse away from. the bonding interface to the wafer edge or are absorbed by the wafers, typically in the surrounding materials. The by-products may also be converted to other by-products that diffuse away or are absorbed by the wafers. The amount of covalent and/or ionic bonding may be increased by removal of converted species resulting in further increase in bond strength.

FIGS. 4A–4E show surface conditions and the bonding propagation to form covalent bonds in the case of a planar Si wafer covered with silicon oxide. On Si wafer 40 an $SiO_{02}$ layer 41 is formed, which has been polished and planarized. Surface 42 of layer 41 is subjected to the VSE process to produce an activated surface (FIG. 4A). On a second wafer 44 a second $SiO_2$ layer 45 is formed, and surface 46 is subjected to a VSE process to activate surface 46 (FIG. 4B). Desired species are terminated on surface 46 and are shown as lines 43 in FIG. 4C. Either or both of a VSE and post-VSE processes are used to properly terminate surface 46. While not shown, surface 42 may also be terminated using a post-VSE process. Wafer 44 is brought together with wafer 40 (FIG. 4D) and bonds 46 begin to form. The bonding propagates and by-products are removed (indicated as arrows 47) and chemical bonds (such as covalent) are formed, as shown in FIG. 4E.

Figure 7:
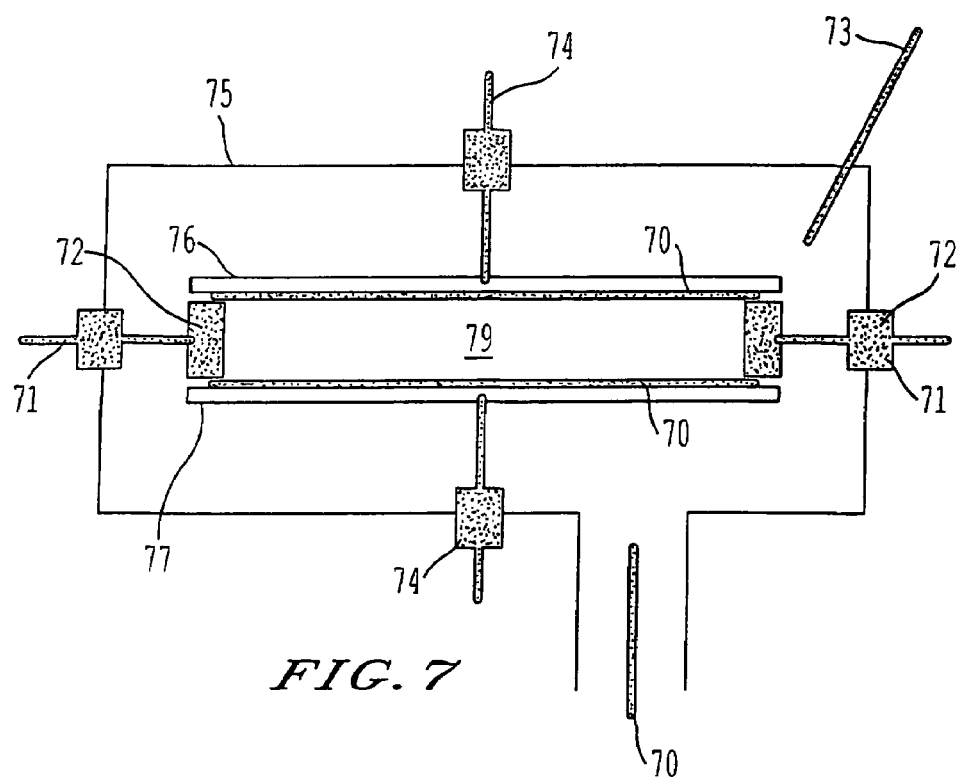
FIG. 7 is a diagram of a bonding fixture used in the invention; nd

The bonding immediately after the RIE process may use a special bonding fixture allowing immediate in situ bonding of the etched wafers. A diagram of the fixture is shown in FIG. 7. In plasma chamber 75 are two wafers to be bonded 70 disposed on RF electrodes 76 and 77. A plasma is formed in zone 79 by the application of RF power to the electrodes via moveable vacuum RF power feedthrough 74 and by the introduction of an appropriate gas or gas mixture through gas feedthrough 73. Element 71 is a vacuum feedthrough for mechanical actuator (not shown) to retract retractable spacer 72. Chamber 75 is pumped down to a desired vacuum level via pumps (not shown) and chamber inlet 78. In the case where a post-VSE process or post cleaning process is also a dry process, as discussed above, the VSE and post-VSE or post-cleaning may be conducted in chamber 75.

After the plasma treatment to conduct the VSE process, the mechanical spacers 72 are retracted by the mechanical actuator and the wafers 70 are moved into contact with to begin the bonding process. The bonded wafers are then moved from the chamber into ambient or into another vacuum chamber (not shown) and stored for a desired period to allow the bonding to propagate by a wafer handling system (not shown).

The materials of the bonding layers preferably have an open structure so that the by-products of the polymerization reaction can be easily removed. The bonding species on the opposing bonding surfaces must be able to react at room temperature to form a strong or chemical bond. The bond energy is sufficiently high to virtually eliminate slippage between wafers after subsequent heat treatments associated with a subsequent processing or operation when wafers have different thermal expansion coefficients. Lack of slippage is manifest by a lack of wafer bowing upon inspection after the subsequent processing or operation.

In order to achieve the high bonding energies, it is preferable for at least one of the wafers to be as thin as possible because a thin wafer allows compliance to accommodate a lack of perfect surface planarization and smoothness. Thinning to thickness of about 10 mils to 10 microns is effective.

The bonded wafers are preferably stored at ambient or at low or room temperature after bonding to allow removal of species or converted species for a specified period of time depending upon the materials and species used. Twenty four hours is usually preferable. The storage time is dependent upon the type of plasma process used. Chemical bonds may be obtained more quickly, in a matter of minutes, when certain plasma processes such as an Ar plasma are used. For example, 585 $mJ/m^2$ bonds were obtained in immediately after bonding and over 800 mJ/m2 were observed after 8 hours for deposited oxides etched by an Ar plasma followed by $NH_4OH$ dip.

Annealing the bonded wafers during bonding may increase the bonding strength. The annealing temperature should be below 200° C. and may be typically in the range of 75–100° C. Storing the bonded wafers under vacuum may facilitate the removal of residual gasses from the bonding surfaces, but is not always necessary.

All of the processes above may be carried out at or near room temperature. The wafers are bonded with sufficient strength to allow subsequent processing operations (lapping, polishing, substrate removal, chemical etching, lithography, masking, etc.). Bonding energies of approximately 500–2000 $mJ/m^2$ or more can be achieved (see FIG. 6A).

At this point (FIG. 3E) it is possible to remove a part or all of the substrate of wafer 35 by, for instance, lapping and etch back. The layer of devices of wafer 35 is thus transferred onto wafer 30. The devices from the two layers may be interconnected. Additional device or circuit layers may be bonded and interconnected to form a multilayer structure. Different types of wafers, devices or circuits may be bonded, as well as different technologies (i.e. CMOS and bipolar or III-V HBT and Si CMOS). Other elements or materials such as thermal spreaders, surrogate substrates, antennas, wiring layers, a pre-formed multi-layer interconnects, etc. may be bonded to produce different types of circuits or systems, as desired.

Figure 2:
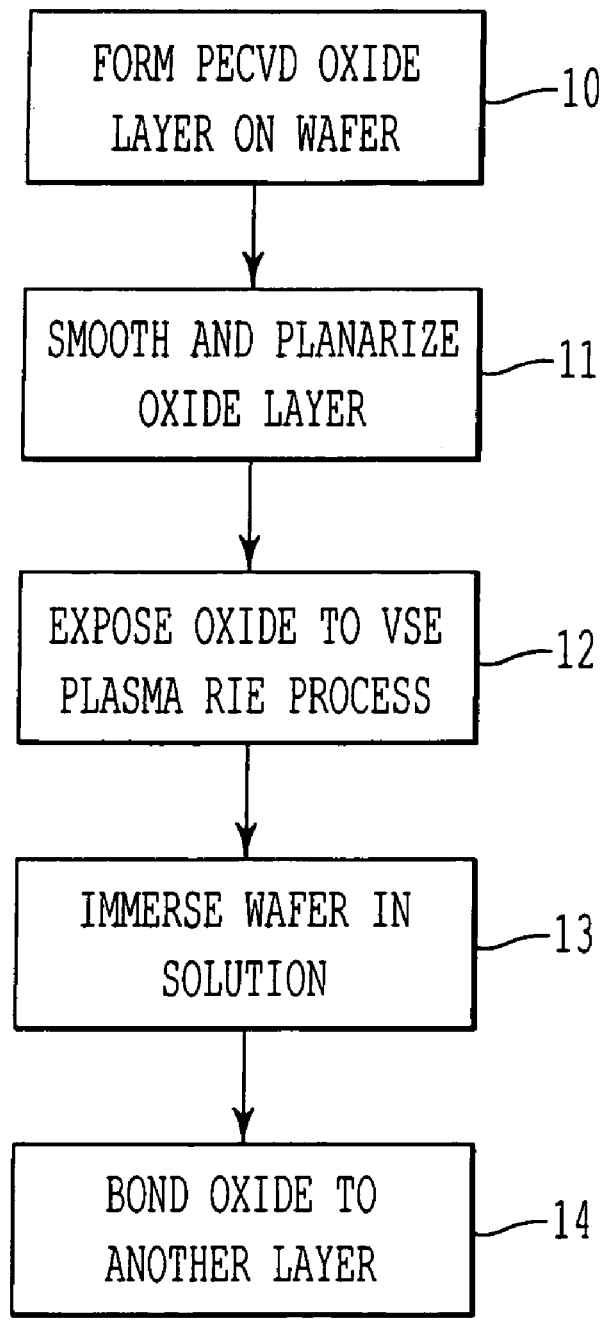
FIG. 2 is a flow chart of an example of the method according to the invention.

In an example, shown in FIG. 2, PECVD $SiO_2$ is deposited on a Si wafer containing devices. Surface 34, after the plasma (such as argon, oxygen or $CF_4$) treatment, is mainly terminated by Si—OH groups due to the availability of moisture in the plasma system and in air. After the plasma treatment, the wafers are immediately immersed in solution such as ammonium hydroxide ($NH_4OH$), $NH_4F$ or HF for a period such as between 10 and 120 seconds. After immersing the wafers in the $NH_4OH$ solution, many Si—OH groups are replaced by Si—NH2 groups according to the following substitution reaction:

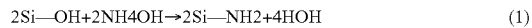

Alternatively, many Si—F groups are terminating on the PECVD $SiO_2$ surface after an $NH_4F$ or HF immersion.

The hydrogen bonded Si—NH2:Si—OH groups or Si—NH2:Si—NH2 groups across the bonding surfaces can polymerize at room temperature in forming Si—O—Si or Si—N—N—Si (or Si—N—Si) covalent bonds:

Alternatively, the HF or $NH_4F$ dipped oxide surfaces are terminated by Si—F groups in addition to Si—OH groups. Since HF or $NH_4F$ solution etches silicon oxide strongly, their concentrations must be controlled to an adequately low level, and the immersion time must be sufficiently short. This is an example of a post-VSE process being a second VSE process. The covalent bonds across the bonding interface are formed due to the polymerization reaction between hydrogen bonded Si—HF or Si—OH groups:

Si—HF+Si—HF→Si—F—F—Si+H2 (4)

Si—F+Si—OH→Si—O—Si+HF (5)

Figure 8:
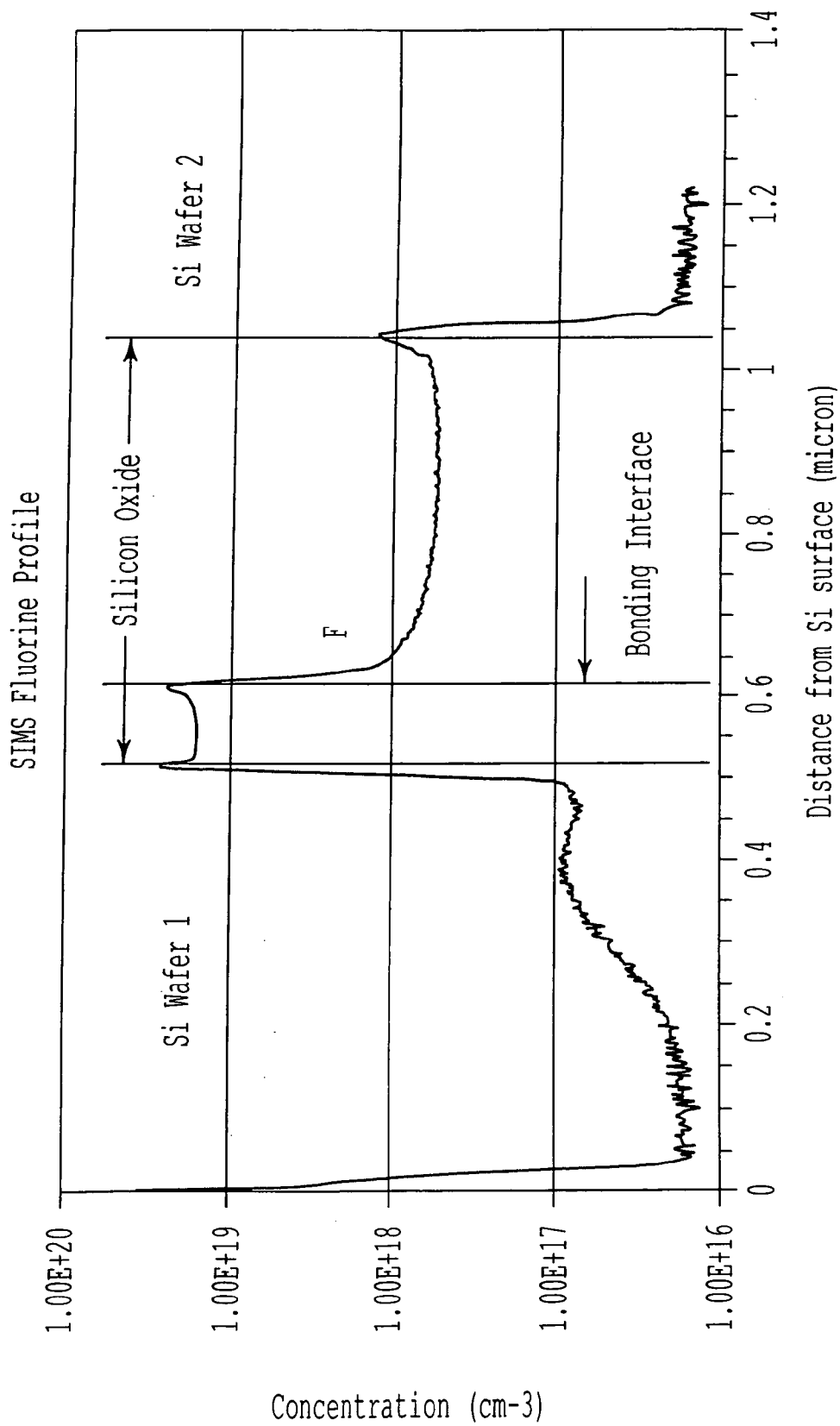
FIG. 8 is a fluorine concentration profile by SIMS (Secondary Ion Mass Spectroscopy) near the bonding interface of deposited oxide covered silicon wafers that were very slight etched by diluted HF before bonding.

FIG. 8 shows the fluorine concentration profile of bonded thermal oxide covered silicon wafers that were dipped in 0.05% HF before room temperature bonding. A fluorine concentration peak is clearly seen at the bonding interface. This provides evidence of the chemical process described above where the desired species are located at the bonding interface.

Since reaction (2) is reversible only at relatively high temperatures of ~500° C., the formed siloxane bonds should not be attacked by $NH_3$ at lower temperatures. It is known that $H_2$ molecules are small and diffuse about 50 times quicker than water molecules in oxide. The existence of a damaged layer near the surface of an adequate thickness i.e. a few nm, will facilitate the diffusion or dissolution of $NH_3$, and HF and hydrogen in reactions (2), (3), (4) and/or (5) in this layer and enhancement of the chemical bond. The three reactions result in a higher bonding energy of $SiO_2/SiO_2$ bonded pairs at room temperature after a period of storage time to allow $NH_3$ or $H_2$ to diffuse away.

In the example of FIG. 2, the plasma treatment may create a damaged or defective area in the oxide layer near the bonding surface. The zone extends for a few monolayers. The damaged or defective area aids in the removal of bonding by-products. Efficient removal of the bonding by-products improves the bonding strength since the by-products can interfere with the bonding process by preventing high-strength bond from forming.

Many different surfaces of materials may be smoothed and/or planarized, followed by a cleaning process, to prepare for bonding according to the invention. These materials can be room temperature bonded by mating surfaces with sufficient planarity, surface smoothness, and passivation that includes cleaning, and/or VSE, activation and termination. Amorphous and sintered materials, non-planar integrated circuits, and silicon wafers are examples of such materials. Single crystalline semiconductor or insulating surfaces, such as $SiO_2$ or Si surfaces, can also be provided with the desired surface roughness, planarity and cleanliness. Keeping the surfaces in high or ultra-high vacuum simplifies obtaining surfaces sufficiently free of contamination and atomic reconstruction to achieve the strong bonding according to the invention. Other semiconductor or insulator materials such as InP, GaAs, SiC, sapphire, etc., may also be used. Also, since PECVD $SiO_2$ may be deposited on many types of materials at low temperatures, many different combinations of materials may be bonded according to the invention at room temperature. Other materials may also be deposited as long as appropriate processes and chemical reactions are available for the VSE, surface activation, and termination.

For example, the method may also be used with silicon nitride as the bonding material. Silicon nitride may be bonded to silicon nitride, or to silicon dioxide and silicon. Silicon oxide may also be bonded to silicon. Other types of dielectric materials may be bonded together including aluminum nitride and diamond-like carbon.

The method may be applied to planar wafers having no devices or circuits and one wafer with devices and circuits. The planar wafer may be coated with a bonding layer, such as PECVD oxide or amorphous silicon, and then processed as described above to bond the two wafers. The planar wafer may not need to be coated with a bonding layer if it has sufficient smoothness and planarity and the proper bonding material.

As can be appreciated, the bonding process may be repeated with any number of wafers, materials or functional elements. For example, two device or IC wafers may be joined, followed by removing one of the exposed substrates to transfer a layer or more of devices, or just the active regions of an IC.

The bonding according to the invention may be applied to joining different types of materials. For example, a silicon wafer can be bonded to another silicon wafer, or bond to an oxidized silicon wafer. The bare silicon wafer and the oxide covered wafer are immersed in HF, $NH_4F$ and/or $NH_4OH$ and bonded after drying. The time for the immersion should be less than about twenty minutes for the silicon wafer covered with the thin oxide since the $NE_4OH$ solution etches silicon oxide. Since HF and $NH_4F$ etches oxides strongly, very diluted solutions, preferably in 0.01–0.2% range should be used for dipping of the silicon wafers.

After drying the silicon wafer and the oxide-covered wafer are bonded in ambient at room temperature. Reactions (2), (3), (4) and/or (5) take place at the bonding interface between the two wafers. The plasma-treated wafers may also be immersed in deionized water instead of the $NH_4OH$ solution.

The silicon bonding may be conducted with a bare silicon wafer, i.e. having a native oxide or a silicon wafer having an oxide layer formed on its surface as described above. During the oxygen plasma treatment, the native oxide which if formed on the bare silicon wafer is sputter etched, and the oxide layer formed on the silicon surface is etched. The final surface is an activated (native or formed) oxide. When rinsed in deionized water, the activated oxide surface is mainly terminated with Si—OH groups. Since oxide growth in oxygen plasma has been found to have less water than in normal native oxide layers, the water from the original bonding bridge and generated by the following polymerization reaction (6) can be absorbed into the plasma oxide readily.

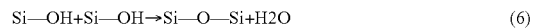

Si—OH+Si—OH→Si—O—Si+H2O (6)

FIGS. 5A–5E illustrate bonding two silicon wafers. Wafers 50 and 52 have respective surfaces 51 and 53 with native oxides (not shown) subjected to a VSE process. Surface 53 is in FIG. 5C is shown terminated with a desired species 54. The two wafers are brought together and bonds 55 begin to form (FIG. 5D). The bonding propagates and bonding by-products, in this case $H_2$ gas, are removed. The by-products being removed are shown as arrows 56 in FIG. 5E.

In addition to removal of the water from the bonding interface by dissolving into the plasma activated oxide of the oxidized silicon wafer, the water can also diffuse through the thin oxide layer on the bare silicon wafer to react with silicon. As the silicon surface underneath the oxide has a damaged or defective zone, extending for a few monolayers, the water molecules that diffuse through the oxide layer and reach the damaged or defective zone can be converted to hydrogen at room temperature and be removed readily:

Si+2H2O→SiO2+2H2 (7)

The reverse reaction of (6) is thus avoided and the room temperature bonding energy increases enormously due to the formation of covalent Si—O—Si bonds.

If a relatively thick (~5 run) oxide layer is formed, it will take a long period of time for the water molecules to diffuse through this thick layer. On the other hand, if after the plasma treatment a thin oxide layer is left or a too narrow defective zone is formed, water that can reach the silicon surface may not react sufficiently with the silicon and convert to hydrogen. In both cases the bonding energy enhancement will be limited. The preferred oxygen plasma treatment thus leaves a minimum plasma oxide thickness (e.g., about 0.1–1.0 nm) and a reasonably thick defective zone (e.g., about 0.1–0.3 nm) on the silicon surface.

In a second embodiment, the VSE process uses wet chemicals. For example, an InP wafer having a deposited silicon oxide layer, as in the first embodiment, and a device layer are bonded to a AlN substrate having a deposited oxide layer. After smoothing and planarizing the InP wafer bonding surface and the AlN wafer bonding surface, both wafers are cleaned in an standard RCA cleaning solution. The wafers are very slightly etched using a dilute HF aqueous solution with an HF concentration preferably in the range of 0.01 to 0.2%. About a few tenths of a nm is removed and the surface smoothness is not degraded as determined by AFM (atomic force microscope) measurements. Without deionized water rinse, the wafers are spin dried and bonded in ambient air at room temperature. The resulting bonding energy has been measured to reach ~700 $mJ/m^2$ after storage in air. After annealing this bonded pair at 75° C. the bonding energy of 1500 $mJ/m^2$ was obtained. The bonding energy has been measured to reach silicon bulk fracture energy (about 2500 $mJ/m^2$) after annealing at 100°C. If the wafers are rinsed with deionized water after the HF dip, the bonding energy at 100° C. is reduced to 200 $mJ/m^2$, that is about one tenth of that obtained without the rinse. This illustrates the preference of F to OH as a terminating species.

In a third embodiment the VSE process consists of 0.1% HF etching followed by 5 min dip in 0.02% $HN_4F$ solution of thermally oxidized silicon wafers at room temperature after a standard cleaning process. Without rinsing in deionized water, the wafers are bonded after spin drying at room temperature. The bonding energy of the bonded pairs reaches ~1700 $mJ/m^2$ after 100° C. annealing. If the wafers are rinsed in de-ionized water after the HF etching before bonding, the bonding energy of bonded pairs is only 400 $mJ/m^2$, again illustrating the preference of F to OH as a terminating species.

Dilute $NH_4F$ is used in the VSE process to etch silicon oxide covered wafers in a fourth embodiment. The concentration of the $NH_4F$ should be below 0.02% to obtain the desired bonding. The bonding energy of ~600 $mJ/m^2$ can be achieved at room temperature after storage.

A fifth embodiment of the invention is used to bond Si surfaces having a native oxide of about 1 nm in thickness. In the fifth embodiment, after cleaning the Si surface by a standard RCA1 cleaning process, a VSE process using 5 min etching in 70% $HNO_3$+diluted HF (preferably 0.01 to 0.02%) is performed. Wafers are pulled out of the solution vertically with a basically hydrophobic surface. Without rinsing in water, the wafers were bonded at room temperature in air. In this process covalent bonding occurs at room temperature with measured bonding energies typically about 600 $mJ/m^2$. This bonding energy is significantly increased to 1300 $mJ/m^2$ after annealing at 75° C. and reaches the fracture energy of bulk silicon (about 2500 $mJ/m^2$) at a temperature of 100° C.

Instead of 70% $HNO_3$, diluted $HNO_3$ with water can be used in the solution to achieve similar results. According to AMF measurements and high resolution transmission electron microscopy measurement results, the silicon is etched in the dilute $HNO_3$ VSE process at a rate of 0.1–0.15 nm/min and a new thick oxide 2.5–3.5 nm in thickness is formed.

As further embodiments, the VSE process may consist of a dry etch that has chemical and/or physical components. For a bare Si surface, chemical etching may result from $SF_4/H_2$ gas mixture while physical etching may result from Ar etch. For a silicon oxide surface, chemical etching may use $CF_4$ while physical etching may use oxygen or argon gas. It is also possible to use a thermally stable polymer material for the bonding materials and bond two polymer surfaces together. Examples are polyimides or spin-on materials.

The mechanisms governing the increased bond energy at low or room temperature are similar. A very slight etching (VSE) of the bonding wafers by plasma to clean and activate the surfaces, and improve removal of by-products of interface polymerization to prevent the undesirable reverse reaction and rinse in appropriate solution to terminate the surface with desired species to facilitate room temperature covalent bonding. The oxide covered wafer bonding case is similar except that a different surface termination is preferred. In bare silicon wafer bonding, the highly reactive surface layers of oxide and silicon to allow water adsorption and conveision to hydrogen should be formed. The highly reactive layers can be a plasma thin oxide layer and a damaged silicon surface layer. The oxide on the silicon wafer will also have some damage. Not only $O_2$ plasma but also plasma of other gases (such as Ar, $CF_4$) are adequate. Because during and after VSE the silicon surface is ready to react with moisture to form an oxide layer, and the underlying damaged silicon layer is created by VSE. Since the VSE and by-products removal methods are rather general in nature, this approach can be implemented by many means and apply to many materials.

EXAMPLE 1

In a first example, three inch <100>, 1–10 ohm-cm, boron doped silicon wafers were used. PECVD oxide was deposited on some of the silicon wafers. For comparison, thermal oxidized silicon wafers were also studied. The PECVD oxide thickness was 0.5 µm and 0.3 µm on the front side and the back side of the wafers, respectively. Oxide is deposited on both sides of the wafer to minimize wafer bow during polishing and improve planarization. A soft polish was performed to remove about 30 nm of the oxide and to smooth the front oxide surface originally having a root mean square of the micro-roughness (RMS) of ~0.56 nm to a final ~0.18 nm. A modified RCA1 solution was used to clean the wafer surfaces followed by spin-drying.

Two wafers were loaded into the plasma system, both wafers are placed on the RF electrode and treated in plasma in RIE mode. For comparison, some wafers were treated in plasma mode in which the wafers were put on the grounded electrode. An oxygen plasma was used with a nominal flow rate of 16 scc/m. The RF power was 20–400 W (typically 80 W) at 13.56 MHz and the vacuum level was 100 mTorr. The oxide covered wafers were treated in plasma for times between 15 seconds to 5 minutes. The plasma treated silicon wafers were then dipped in an appropriate solution or rinsed with de-ionized water followed by spin-drying and room temperature bonding in air. Some of the plasma treated wafers were also directly bonded in air without rinse or dipping.

The bonding energy was measured by inserting a wedge into the interface to measure the crack length according to the equation:

$$\gamma = \frac{3t_b^2 E_1 t_{w1}^3 E_2 t_{w2}^3}{16L^4(E_1 t_{w1}^3 + E_2 t_{w2}^3)}$$

E and tw are the Young's modulus and thickness for wafers one and two and tb is the thickness of a wedge inserted between the two wafers that results in a wafer separation of length L from the edge of the wafers.

Figure 6A:
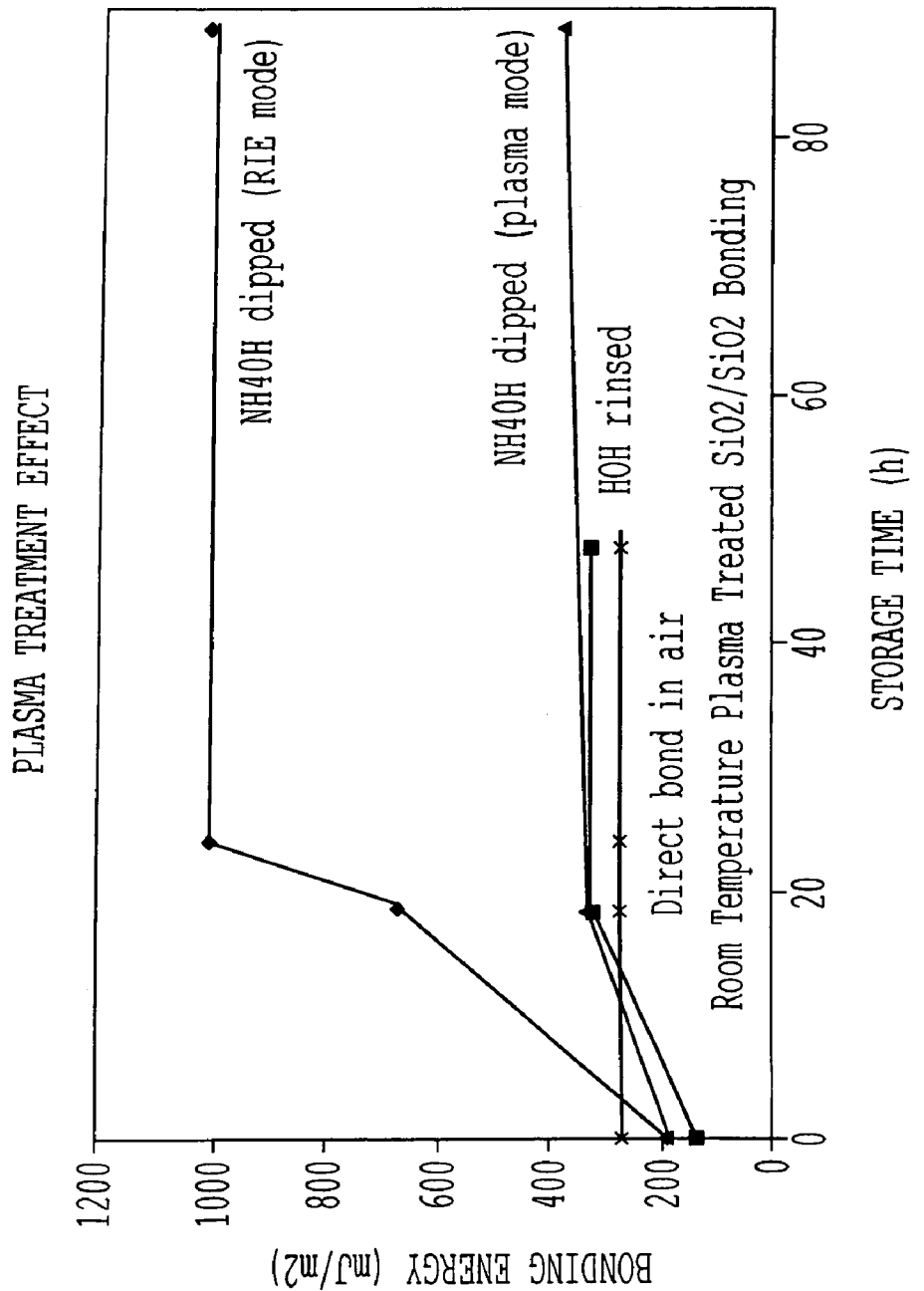
FIGS. 6A and 6B are graphs of room temperature bonding energy versus storage time.

The room temperature bonding energy as a function of storage time of bonded plasma treated oxide covered silicon wafers is shown in FIG. 6A. This figure shows measured room temperature bonding energy versus storage time for 4 different cases as shown. The results can be summarized as follows: (1) for dipped and bonded RIE plasma treated oxide wafers, the room temperature bonding energy increases with storage time and reaches a stable value after ~20 h in air or at low vacuum; (2) RIE mode results in higher bonding energies than plasma mode; (3) too short a plasma exposure time or too low a plasma power provides a small or negligible increase in bond energy; (4) $NH_4OH$ dip after plasma treatment shows a much higher increase in bonding energy than water rinse; (5) direct bonding in air after plasma treatment without dipping or rinse shows an almost constant bonding energy with time. The bonding energy of the directly bonded wafer pairs immediately after room temperature bonding is slightly higher than the de-ionized water rinsed or $NH_4OH$ dipped wafer pairs.

Figure 6B:
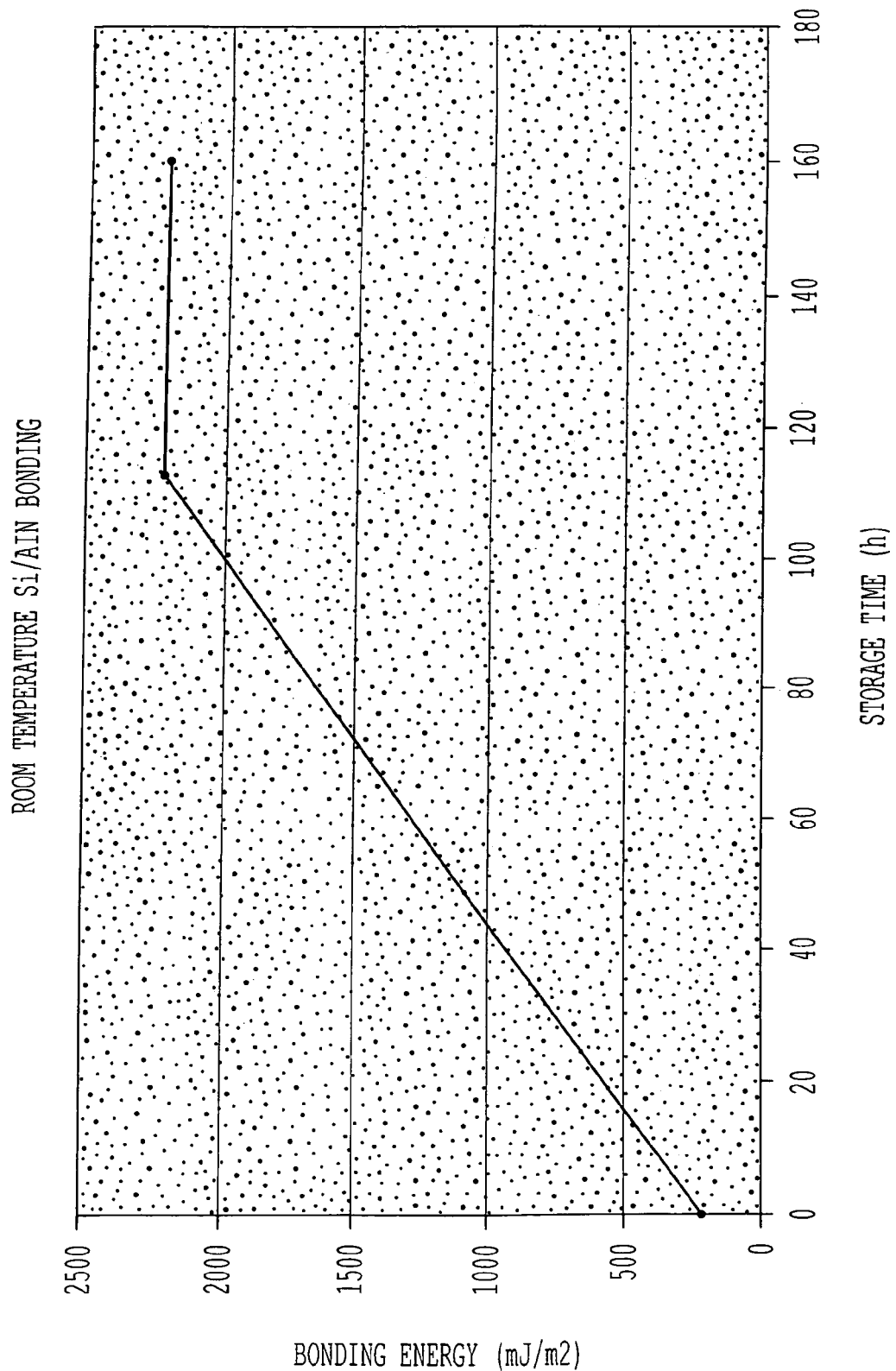

FIG. 6B shows room temperature bonding of Si and AlN wafers with PECVD oxide deposited layers. After about 100 h of storage time a bonding energy of over 2000 mJ/m$^2$ were observed.

Comparing different bonding materials, the bonding energy as a function of storage time of $O_2$ plasma treated thermally oxidized silicon wafer pairs is similar to wafers with PECVD oxide, although the values of the room temperature bonding energy are somewhat lower.

After ~24 h storage in air at room temperature, the bonding energy as high as ~1000 mJ/m2 was reached in the RIE mode plasma treated and $NH_4OH$ dipped PECVD oxide covered wafer pairs. Since the maximum bonding energy of a van der Waals bonded silicon oxide covered wafer pairs is about 200 mJ/m2, a large portion of the bonding energy is attributed to the formation of covalent bonds at the bonding interface at room temperature according to the above equation.

EXAMPLES 2–3

The above process was applied to bond processed InP wafers (600 μm thick) to AlN wafers (380 μm thick), or to bond processed Si (380 μm thick) and InP (600 μm thick) wafers, as second and third examples. The processed InP device wafers are covered with PECVD oxide and planarized and smoothed by chemical-mechanical polishing CMP. A PECVD oxide layer is also deposited on the AlN wafers and is planarized and smoothed to improve the RMS surface roughness. The processed Si and processed InP wafers are deposited with PECVD oxide and planarized and smoothed using CMP. After VSE similar to the example 1 bonding at room temperature, the bonded wafers are left in ambient air at room temperature.

After 24 hours storage at room temperature, bonding energy of 1000 mJ/m2 and 1100 mJ/m2 were achieved for the InP/Si and InP/AlN bonded pairs, respectively. For processed Si (380 μm thick) /oxide covered AlN (280 μm thick) wafer pairs, the bonding energy at room temperature as high as 2500 mJ/m2 has been achieved. These room temperature bonded plasma treated wafer pairs have sufficient bonding strength to sustain subsequent substrate lapping and etching and other typical semiconductor fabrication processes before or after substrate removal.

The InP substrate in the room temperature bonded InP/AlN pairs was lapped with 1900# Al2O3 powder from initial 600 μm thick to ~50 μm thick followed by etching in an HCl/H3PO4 solutionto leave about a 2.0 μm thick InP device layer on the AlN or Si wafer. The water and etching solution did not penetrate into the bonding interface.

Surfaces are sputter etched by energetic particles such as radicals, ions, photons and electrons in the plasma or RIE mode. For example, the $O_2$ plasma under conditions that bring about the desired VSE is sputter-etching about 2 Å/min of PECVD oxide as measured by a reflectance spectrometry. For thermal oxide the sputter etching rate is about 0.5 Å/min. The thickness of oxide before and after plasma treatment was measured by a reflectance spectrometry and averaged from 98 measured points on each wafer. The etching by $O_2$ plasma has not only cleaned the surface by oxidation and sputtering but also broken bonds of the oxide on the wafer surfaces.

However, the surface roughness of plasma treated oxide surfaces must not be degraded by the etching process. AFM measurements show that compared with the initial surface roughness, the RMS of the $O_2$ plasma treated oxide wafers was ~2 Å and did not change noticeably. On the other hand, if the etching is not sufficiently strong, the bonding energy enhancement effect is also small. Keeping other conditions unchanged when the $O_2$ plasma treatment was performed with plasma mode rather than RIE mode, the etching of oxide surfaces is negligible and the oxide thickness does not change. The final room temperature bonding energy is only 385 mJ/m2 compared to 1000 mJ/m2 of RIE treated wafers (see FIG. 6A).

Other gas plasma has shown a similar effect. $CF_4/O_2$ RIE was used to remove ~4 nm of PECVD oxide from the wafer surfaces prior to bonding. The bonding energy of room temperature bonded PECVD oxide covered silicon wafers was also enhanced significantly in this manner and exceeds 1000 mJ/m2 after sufficient storage time (see also FIG. 6A).

An argon plasma has also been used for the VSE with a nominal flow rate of 16 scc/m. The RF power was typically 60 W at 13.56 MHz and the vacuum level was 100 mtorr. The oxide covered silicon wafers were treated in plasma in RIE mode for times between 30 seconds to 2 minutes. The plasma treated silicon wafers were then dipped in an $NH_4OH$ solution followed by spin-drying and room temperature bonding in air. The bonding energy reached 800 mJ/m$^2$ at room temperature after only 8 h storage in air.

Obviously, numerous modifications and variations of the present invention are possible in light of the above teachings. It is therefore to be understood that within the scope of the appended claims, the invention may be practiced otherwise than as specifically described herein.

What is claimed as new and desired to be protected by Letters Patents is:

1. A bonded device, comprising:
   a first material having a first etched bonding surface; and a second material having a second etched bonding surface directly bonded to said first etched bonding surface at room temperature having a bonding strength of at least about 500 to 2000 mJ/m$^2$.

2. A device as recited in claim 1, comprising:
said first and second bonding surfaces being activated and terminated with a terminating species.

3. A device as recited in claim 2, wherein said terminating species comprises:
a monolayer of one of an atom and a molecule on said bonding surface.

4. A device as recited in claim 2, wherein said terminating species comprises at least one of a silanol group, an NH$_2$ group, a fluorine group and an HF group.

5. A device as recited in claim 1, comprising:
said first and second bonding surfaces each having a defective region located proximate to said first and second bonding surfaces, respectively.

6. A device as recited in claim 1, wherein:
said first material comprises a surface of a first semiconductor wafer having devices formed therein; and
said second material comprises a surface of a second semiconductor wafer having devices formed therein.

7. A device as recited in claim 6, wherein one of said first and second semiconductor wafers comprises a device region after removing a substantial portion of a substrate of said one of said first and second wafers.

8. A device as recited in claim 6, comprising:
devices in said first and second semiconductor wafers being interconnected.

9. A device as recited in claim 6, comprising:
said first and second semiconductor wafers being of different technologies.

10. A device as recited in claim 1, wherein:
one of said first and second semiconductor wafers comprises an integrated circuit.

11. A device as recited in claim 10, comprising:
devices in said first and second semiconductor wafers being interconnected.

12. A device as recited in claim 10, comprising:
said first and second semiconductor wafers having an irregular surface topology.

13. A device as recited in claim 1, wherein:
said first material comprises a first wafer containing electrical devices and having a first non-planar surface; and
said first etched bonding surface comprises a polished and etched deposited oxide layer on said first non-planar surface.

14. A device as recited in claim 13, wherein:
said second material comprises a second wafer containing electrical devices and having a second non-planar surface; and
said second etched bonding surface comprises a polished, planarized and etched deposited oxide layer on said second non-planar surface.

15. A device as recited in claim 1, wherein:
said first material comprises a first wafer containing electrical devices and having a first surface with irregular topology; and
said first etched bonding surface comprises a polished, planarized and etched deposited oxide layer on said first surface.

16. A device as recited in claim 15, comprising:
said second material comprises a second wafer containing electrical devices and having a second surface with irregular topology; and
said second etched bonding surface comprises a polished, planarized and etched deposited oxide layer on said second surface.

17. A device as recited in claim 7, wherein:
said device region comprises an annealed device region.

18. A device as recited in claim 6, comprising:
at least one of said devices in said first and second semiconductor wafers containing metal structures.

19. A device as recited in claim 1, comprising:
said first and second etched bonding surface surfaces directly bonded with chemical bonds at about room temperature without application of pressure or voltage to increase bond strength.

20. A bonded structure, comprising:
a first material having a first bonding surface which has been etched, activated and exposed to a nitrogen-based solution after being activated; and
a second material having a second bonding surface which has been etched, activated and exposed to a nitrogen-based solution after being activated;
said first bonding surface being directly bonded to said second bonding surface at about room temperature.

21. A structure as recited in claim 20, comprising:
said first and second bonding surfaces each having a defective region located proximate to said surfaces.

22. A structure as recited in claim 20, comprising each of said first and second bonding surfaces being terminated with a terminating species, wherein said terminating species comprises:
a monolayer of one of an atom and a molecule on said bonding surface.

23. A structure as recited in claim 20, comprising:
said second bonding surface bonded to said first bonding surface at room temperature having a bonding strength of at least about 500 to 2000 mJ/m$^2$.

24. A structure as recited in claim 20, wherein:
said first bonding surface comprises a surface of a first semiconductor wafer having devices formed therein; and
said second bonding surface comprises a surface of a second semiconductor wafer having devices formed therein.

25. A structure as recited in claim 24, wherein one of said first and second semiconductor wafers comprises a device region after removing a substantial portion of a substrate of said one of said first and second semiconductor wafers.

26. A structure as recited in claim 24, comprising:
devices in said first and second semiconductor wafers being interconnected.

27. A structure as recited in claim 24, comprising:
said first and second semiconductor wafers being of different technologies.

28. A structure as recited in claim 24, wherein:
one of said first and second semiconductor wafers comprises an integrated circuit.

29. A structure as recited in claim 28, comprising:
devices in said first and second semiconductor wafers being interconnected.

30. A structure as recited in claim 20, wherein:
said first material comprises a first wafer containing electrical devices and having a first non-planar surface; and
said first bonding surface comprises a polished and etched deposited oxide layer on said first non-planar surface.

31. A structure as recited in claim 30, wherein:
said second material comprises a second wafer containing electrical devices and having a second non-planar surface; and
said second bonding surface comprises a polished, planarized and etched deposited oxide layer on said second non-planar surface.

32. A structure as recited in claim 20, wherein:
said first material comprises a first wafer containing electrical devices and having a first surface with irregular topology; and
said first bonding surface comprises a polished, planarized and etched deposited oxide layer on said first surface.

33. A structure as recited in claim 32, wherein:
said second material comprises a second wafer containing electrical devices and having a second surface with irregular topology; and
said second bonding surface comprises a polished, planarized and etched deposited oxide layer on said second surface.

34. A structure as recited in claim 20, wherein:
said first and second materials comprise respective first and second substrates; and
one of said first and second substrates comprises a substrate region obtained by removing a substantial portion of a substrate of said one of said first and second substrate.

35. A structure as recited in claim 34, wherein:
said substrate region comprises an annealed substrate region.

36. A structure as recited in claim 24, comprising:
at least one of said devices in said first and second semiconductor wafers containing metal structures.

37. A structure as recited in claim 20, comprising:
said first and second bonding surfaces exposed to an ammonia-based solution after being activated.

38. A structure as recited in claim 20, comprising:
said first and second bonding surfaces directly bonded with chemical bonds at about room temperature without application of pressure or voltage to increase bond strength.

39. A structure as recited in claim 20, comprising:
said first material having said first bonding surface which has been etched, activated with a dry process and exposed to a nitrogen-based solution after being activated.

40. A structure as recited in claim 20, comprising:
said first material having said first bonding surface which has been etched with a dry process, activated and exposed to a nitrogen-based solution after being activated.

41. A structure as recited in claim 20, wherein:
at least one of said first and second bonding surfaces is etched using a process separate from a process used to expose said at least one of said first and second bonding surfaces to a nitrogen-based solution.

42. A structure as recited in claim 20, comprising:
said first bonding surface has been etched with a first solution different than said nitrogen-based solution.

43. A bonded structure, comprising:
first and second materials having respective first and second surfaces; said first and second bonding surfaces being etched and terminated with a species allowing formation of chemical bonds at about room temperature; and
said first and second surfaces directly bonded with chemical bonds at about room temperature.

44. A structure as recited in claim 43, comprising:
said first and second surfaces directly bonded with chemical bonds at about room temperature without application of pressure or voltage to increase bond strength.

* * * * *